United States Patent
Ogata et al.

(10) Patent No.: US 9,196,584 B2
(45) Date of Patent: Nov. 24, 2015

(54) LIGHT-EMITTING DEVICE AND LIGHTING APPARATUS USING THE SAME

(71) Applicant: Panasonic Corporation, Osaka (JP)

(72) Inventors: Toshifumi Ogata, Osaka (JP); Masumi Abe, Osaka (JP); Kenji Ueda, Nara (JP); Masashi Funakoshi, Osaka (JP); Kosuke Takehara, Osaka (JP); Keiji Kiba, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 21 days.

(21) Appl. No.: 14/327,778

(22) Filed: Jul. 10, 2014

(65) Prior Publication Data

US 2015/0016109 A1    Jan. 15, 2015

(30) Foreign Application Priority Data

Jul. 12, 2013    (JP) ................. 2013-146917

(51) Int. Cl.
| | |
|---|---|
| H01L 23/48 | (2006.01) |
| H01L 21/44 | (2006.01) |
| H01L 23/522 | (2006.01) |
| H01L 41/047 | (2006.01) |
| H05K 3/28 | (2006.01) |
| F21S 8/02 | (2006.01) |
| F21Y 101/02 | (2006.01) |
| F21Y 105/00 | (2006.01) |
| H05K 1/02 | (2006.01) |

(52) U.S. Cl.
CPC .......... *H01L 23/5228* (2013.01); *H01L 41/047* (2013.01); *H05K 3/284* (2013.01); *F21S 8/026* (2013.01); *F21Y 2101/02* (2013.01); *F21Y 2105/001* (2013.01); *H05K 1/0296* (2013.01); *H05K 2201/10106* (2013.01)

(58) Field of Classification Search
CPC .......................... H01L 23/5228; H01L 41/047
USPC ................. 257/692, 779, 784; 438/612–617
See application file for complete search history.

(56) References Cited

U.S. PATENT DOCUMENTS

| | | | |
|---|---|---|---|
| 7,956,372 B2 | 6/2011 | Kamada et al. | |
| 8,274,634 B2* | 9/2012 | Oikawa | G06F 3/045 349/150 |
| 8,716,736 B2 | 5/2014 | Yamae et al. | |
| 8,736,794 B2 | 5/2014 | Matsuhisa | |
| 8,773,612 B2* | 7/2014 | Sanpei | F21K 9/00 349/56 |
| 2011/0303927 A1 | 12/2011 | Sanpei et al. | |

FOREIGN PATENT DOCUMENTS

| | | |
|---|---|---|
| EP | 2 403 017 | 1/2012 |
| JP | 2011-210621 | 10/2011 |

* cited by examiner

*Primary Examiner* — Calvin Lee
(74) *Attorney, Agent, or Firm* — Greenblum & Bernstein P.L.C.

(57) ABSTRACT

A light-emitting device includes a substrate, first LEDs and second LEDs mounted on the substrate, multiple wirings separately formed on the substrate, and a conductive member for connecting adjacent two wirings in multiple wirings for establishing series connection, parallel connection, or a combination of series and parallel connections of the first LEDs and the second LEDs. This achieves the light-emitting device that can support multiple different specifications, using a single type of substrate.

19 Claims, 17 Drawing Sheets

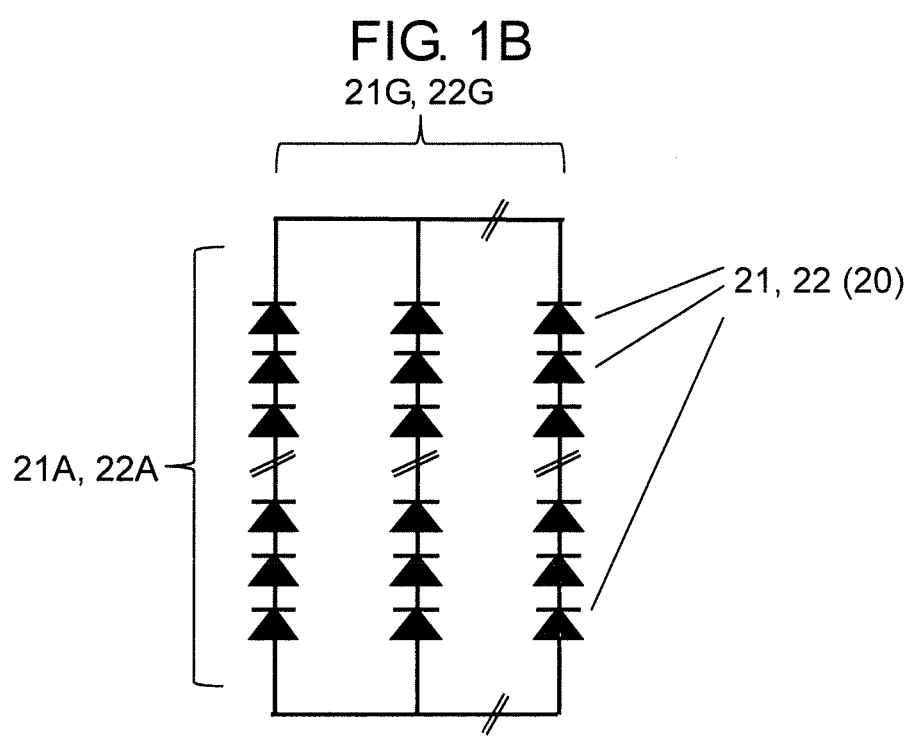

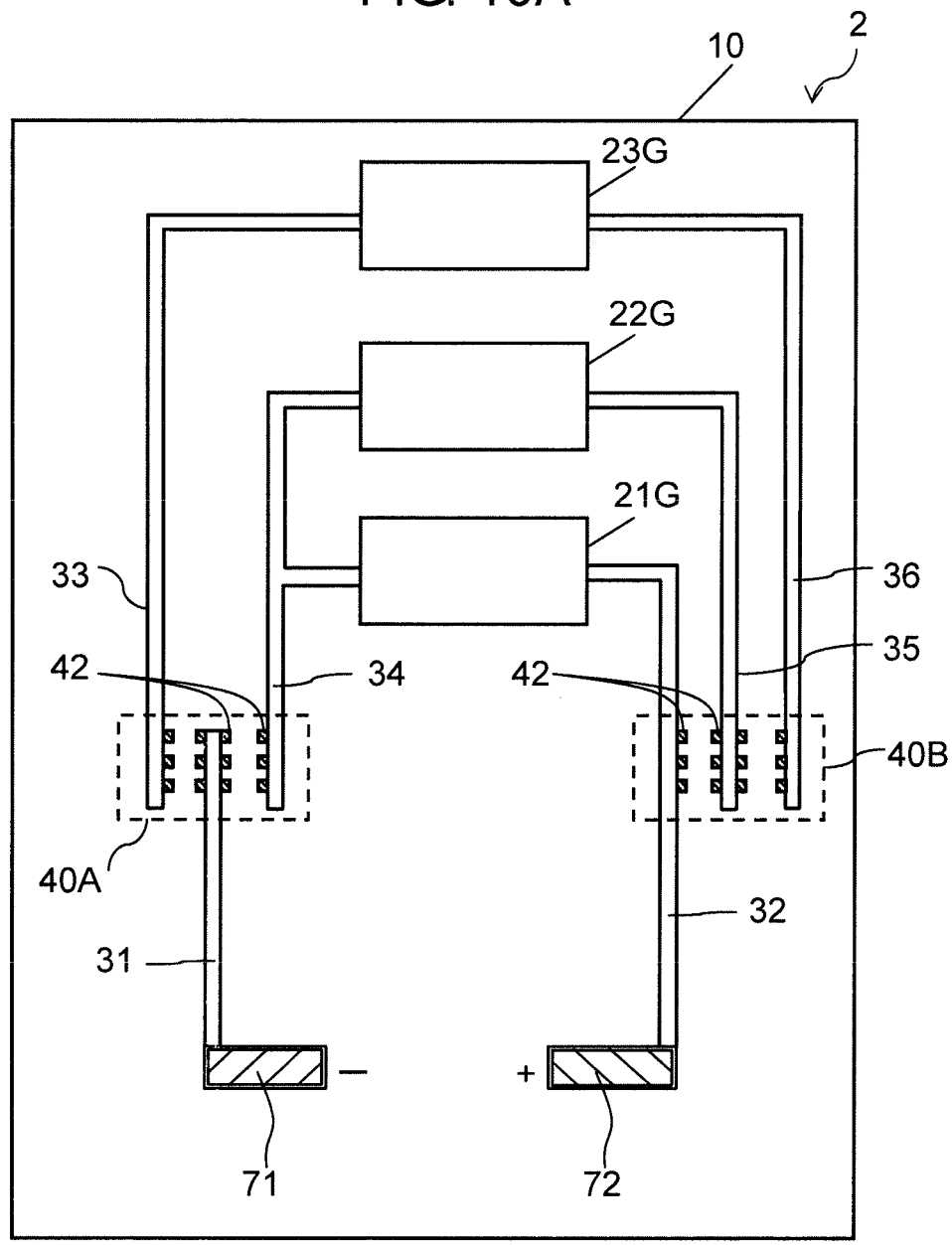

LIGHT-EMITTING DEVICE AND LIGHTING APPARATUS USING THE SAME

BACKGROUND OF THE INVENTION

1. Field of the Invention

The field relates to light-emitting devices, and lighting apparatuses in which light-emitting devices are used.

2. Background Art

Semiconductor light-emitting elements, such as light-emitting diode (LED), are broadly used in a range of apparatuses, such as for lighting and display, as highly-efficient and space-saving light sources.

For example, LEDs are used in alternative lighting apparatuses for conventional lamps, such as incandescent bulbs and fluorescent lamps, and ceiling-embedded lighting apparatuses that are embedded in the ceiling for emitting light downward, such as downlights and spotlights.

LEDs are unitized and built in a range of apparatuses in the form of LED modules (light-emitting devices). These LED modules include a COB (Chip On Substrate) light-emitting device in which multiple LED chips are directly mounted on a substrate, and an SMD (Surface Mount Device) light-emitting device in which multiple packaged SMD-type LED elements are mounted on a substrate.

SUMMARY OF THE INVENTION

A light-emitting device in exemplary embodiments includes a substrate, a first light-emitting element array having multiple first light-emitting elements mounted on the substrate and connected in series, and a second light-emitting element array having multiple second light-emitting elements mounted on the substrate and connected in series. Multiple wirings, including a first wiring, second wiring, third wiring, fourth wiring, and fifth wiring, are provided on the substrate. A first connector in which the first wiring and the third wiring are disposed adjacent to each other and also the first wiring and the fourth wiring are disposed adjacent to each other, and a second connector in which the second wiring and the fifth wiring are disposed adjacent to each other are also provided on the substrate. At least one first conductive member for electrically connecting at least the first wiring and the third wiring or the first wiring and the fourth wiring is provided in the first connector.

This structure achieves a light-emitting device that can support multiple different specifications, using a single type of substrate.

BRIEF DESCRIPTION OF THE DRAWINGS

FIG. 1B is a connecting diagram of a light-emitting element in the light-emitting device in FIG. 1A.

FIG. 10A is a wiring pattern of another light-emitting device in accordance with the exemplary embodiment.

DETAILED DESCRIPTION OF PREFERRED EMBODIMENTS

First, a disadvantage of a conventional light-emitting device is described before describing an exemplary embodiment. LED modules may be required to fulfill different allowable operating voltages depending on destinations (foreign countries), purposes of use, laws, and specifications including standards. Therefore, alignment of LEDs mounted on a substrate needs to be changed or a wiring pattern formed on the substrate needs to be changed depending on specifications. A price of the substrate, which is just one component in the LED module, thus becomes relatively high due to low volume production of a wide variety of substrates. This results in increasing the price of LED module.

The disclosure solves this disadvantage, and aims to offer a light-emitting device that can support multiple different specifications, using a single type of substrate.

To achieve this aim, the light-emitting device in exemplary embodiments includes a substrate, a first light-emitting element array mounted on the substrate and having multiple first light-emitting elements connected in series, and a second light-emitting element array mounted on the substrate and having multiple second light-emitting elements connected in series. Multiple wirings, including a first wiring, second wiring, third wiring, fourth wiring, and fifth wiring, are provided on the substrate. A first connector in which the first wiring and the third wiring are disposed adjacent to each other and also the first wiring and the fourth wiring are disposed adjacent to each other, and a second connector in which the second wiring and the fifth wiring are disposed adjacent to each other are also provided on the substrate. At least one first conductive member electrically connecting at least the first wiring and the third wiring or the first wiring and the fourth wiring is provided in the first connector.

The exemplary embodiments are described below with reference to drawings. The exemplary embodiments described herein are all preferred embodiments. It is thus apparent that values, shapes, materials, components, layout positions and connections of components, processes (steps), process sequences, and so on in the exemplary embodiments are therefore to be considered in all respects as illustrative and not restrictive.

Drawings are all schematic views, and thus they are not necessarily strictly-accurate illustrations. In each drawing, same reference marks are given to practically-same components to omit or simplify duplicate descriptions.

(Light-Emitting Device)

Figure 1A:
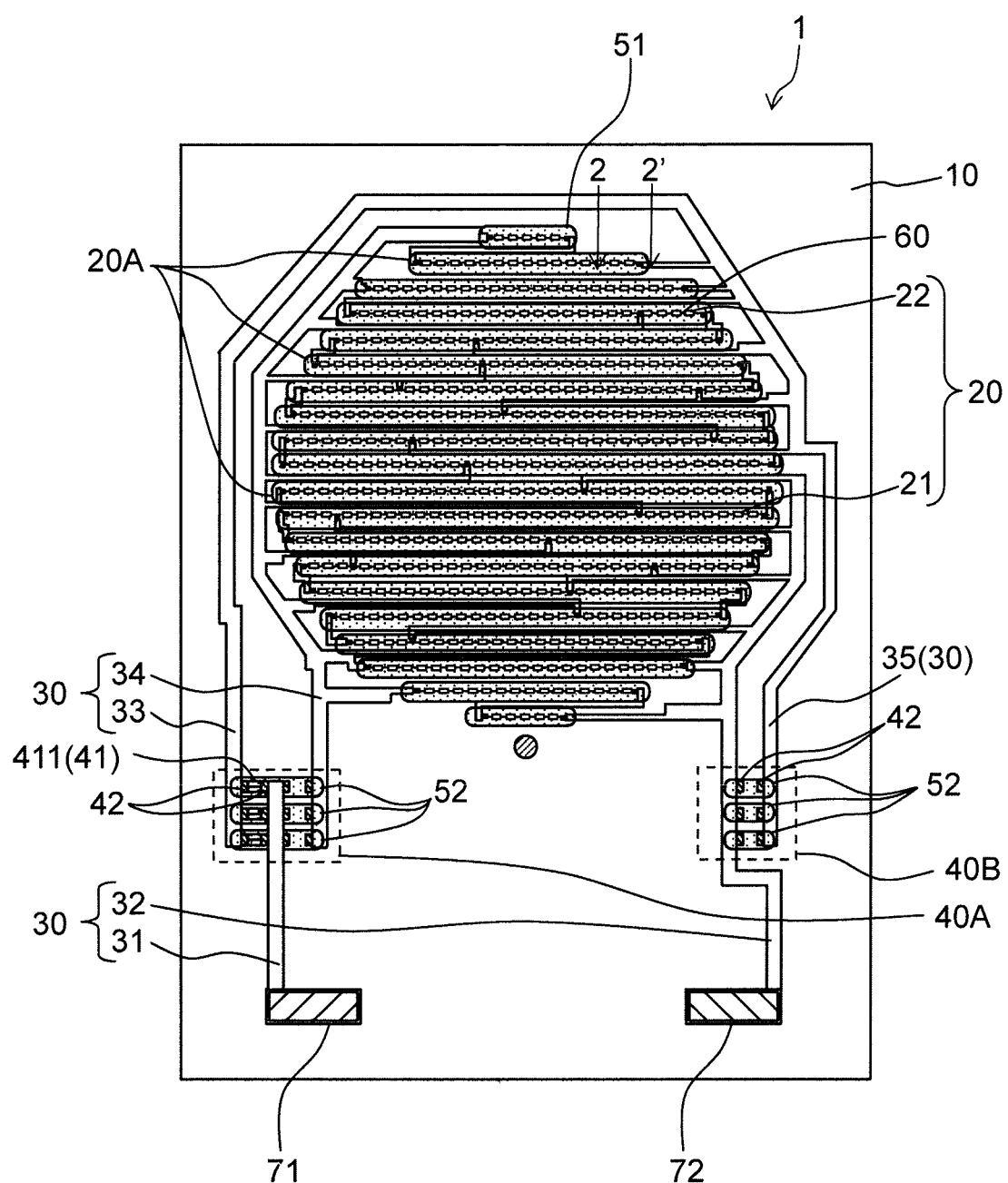
FIG. 1A is a plan view of a light-emitting device in accordance with an exemplary embodiment of the present invention.
Figure 2:
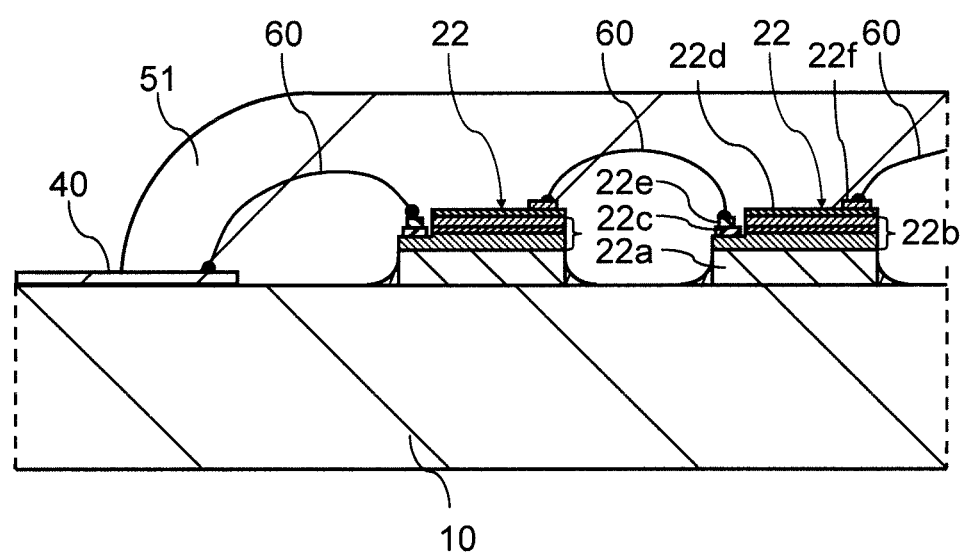
FIG. 2 is a magnified sectional view of the light-emitting device taken along Line 2-2 in FIG. 1A.

A structure of light-emitting device 1 in the exemplary embodiment is described with reference to FIGS. 1A and 1B and FIG. 2. FIG. 1A is a plan view of light-emitting device 1. FIG. 1B is a connecting diagram (circuit diagram) of LEDs 20 in light-emitting device 1. FIG. 2 is a magnified sectional view of light-emitting device 1 taken along line 2-2 in FIG. 1A.

As shown in FIG. 1A, light-emitting device 1 is an LED module configured with multiple LEDs 20 (light-emitting elements). All LEDs 20 can be divided into first LEDs 21 and second LEDs 22. Light-emitting device 1 includes substrate 10, multiple first LEDs 21 and multiple second LEDs 22 mounted on substrate 10, multiple wirings 30 formed on substrate 10, and first connector 40A and second connector 40B in which some of multiple wirings 30 are disposed adjacent to each other for connection.

First LEDs 21 configure first LED array 21A that is an array of light-emitting elements connected in series. Second LEDs 22 configure second LED array 22A that is an array of light-emitting elements connected in series.

In light-emitting device 1, first connector 40A and second connector 40B are provided to allow selection of 1) series connection or 2) parallel connection of first LEDs 21 and second LEDs 22 at the time of assembly. Each of first connector 40A and second connector 40B is configured with at least one first conductive member 411 for mutually connecting adjacent wirings 30 in multiple wirings 30, and at least one connection pad 42.

Multiple wirings 30 include first wiring 31, second wiring 32, third wiring 33, fourth wiring 34, and fifth wiring 35. As shown in FIG. 1A, third wiring 33 and fifth wiring 35 may be integrally formed.

In first connector 40A, first wiring 31 and third wiring 33 are disposed adjacent to each other, and wiring 31 and fourth wiring 34 are disposed adjacent to each other. In second connector 40B, second wiring 32 and fifth wiring 35 are connected adjacent to each other.

In first connector 40A, at least first wiring 3 and third wiring 33 or first wiring 31 and fourth wiring 34 are electrically connected by at least one first conductive member 411. FIG. 1A is an example of connecting first wiring 31 and third wiring 33 by first conductive member 411. First conductive member 411 is one of conductive member 41.

Still more, light-emitting device 1 preferably includes multiple first sealing members 51 for sealing each of multiple arrays of linearly-aligned LEDs 20, second sealing member 52 for sealing first conductive member 411; wire 60 for applying current to LEDs 20, and a pair of power supply terminals 71 and 72.

Light-emitting device 1 is an LED module with COB structure in which LED chips are directly mounted on substrate 10. Each component of light-emitting device 1 is detailed below.

[Substrate]

Substrate 10 is a substrate for mounting first LEDs 21 and second LEDs 22. As substrate 10, a ceramic substrate, resin substrate, metal-based substrate, or glass substrate can be typically used.

As a ceramic substrate, alumina substrate or aluminum nitride substrate can be used. As a resin substrate, a glass epoxy substrate or flexible substrate can be typically used. As a metal-based substrate, an aluminum alloy substrate on which an insulating film is formed on its surface, iron-alloy substrate, or copper-alloy substrate can be typically used.

As substrate 10, a white substrate with high optical reflectance (e.g., optical reflectance of 90% or higher) is preferably used. The use of white substrate enables to reflect the light of LEDs 20 on the surface of substrate 10. This improves the light extraction efficiency of light-emitting device 1.

Light-emitting device 1 uses a ceramic substrate as substrate 10. The ceramic substrate has high heat conductivity, compared to a resin substrate, and thus the heat of LEDs 20 can be efficiently dissipated. In addition, the ceramic substrate shows less time degradation and also has good heat resistance.

More specifically, for example, about 1-mm thick white polycrystal alumina substrate (polycrystal ceramic substrate) configured by sintering alumina particles can be used as substrate 10.

Furthermore, for example, a rectangular substrate may be used as substrate 10. Length of one side of substrate 10 may be, for example, 20 mm to 100 mm. For light-emitting device 1, a rectangular substrate whose substrate size is 50 mm×70 mm is used as substrate 10.

[LED]

First LEDs 21 and second LEDs 22 are connected in series in units of multiple pieces, respectively. In light-emitting device 1, multiple first LEDs 21 connected in series configure first LED array 21A, and multiple first LED arrays 21A are connected in parallel to configure first LED group 21G. In the same way, multiple second LEDs 22 connected in series configure second LED array 22A, and multiple second LED arrays 22A are connected in parallel to configure second LED group 22G.

As an example, there are 240 first LEDs 21 and 240 second LEDs 22. In 240 first LEDs 21, twenty first LEDs 21 are connected in series to form one first LED array 21A, and twelve first LED arrays 21A are connected in parallel to form first LED group 21G (twenty series-connections and twelve parallel-connections). In the same way in 240 second LEDs 22, twenty second LEDs 22 connected in series form one second LED array 22A, and twelve second LED arrays 22A connected in parallel form second LED group 22G (twenty series-connections and twelve parallel-connections).

LEDs 20 are also configured as multiple element arrays. In other words, all LEDs 20 are divided into multiple element arrays. Entire LEDs 20 are configured with twenty element arrays (divided element arrays 20A) parallel to each other. In each of twenty divided element arrays 20A, five or more but thirty-two or less LEDs 20 are linearly aligned. In each element array, multiple first LEDs 21 and multiple second LEDs 22 are linearly aligned, respectively. First sealing member 51 seals these first LEDs and second LEDs along the element arrays.

However, in light-emitting device 1, LEDs 20 in one divided element array 20A are not entirely connected in series. A series element array (first LED array 21A or second LED array 22A) configured with twenty LEDs 20 (first LEDs 21 or second LEDs 22) connected in series may be entirely aligned in one divided element array 20A, or may be aligned across multiple arrays using adjacent divided element array 20A. In other words, at least first LEDs 21 or second LEDs 22 may be divided and aligned in multiple linear arrays.

When light-emitting device 1 is seen from the top, LEDs 20 are aligned such that entire multiple divided element arrays 20A form a circle. In other words, the number of LEDs 20 mounted in each divided element array 20A is adjusted such that entire twenty divided element arrays 20A look round.

A mounting pitch of LEDs 20 (first LEDs 21 and second LEDs 22) is, for example, from 0.7 mm or more to 3.0 mm or less. In light-emitting-device 1, the pitch is 1.0 mm.

First LEDs 21 and second LEDs 22 can be electrically connected in series or parallel, or connected in combination of series and parallel, using wirings 30 and wires 60, respectively.

First LEDs 21 and second LEDs 22 are an example of a semiconductor light-emitting element, and emit light by applying predetermined power. First LEDs 21 and second LEDs 22 are all bare chips that emit unicolor visible light. For example, they are blue LED chips that emit blue light when current is applied. As a blue LED chip, for example, gallium nitride semiconductor light-emitting element configured with InGaN material with the center wavelength of 440 nm to 470 nm can be used.

More specifically, as shown in FIG. 2, second LED 22, which is a blue LED chip, includes sapphire substrate 22A and multiple nitride semiconductor layers 22B configured with different compositions from each other that are laminated on sapphire substrate 22a.

Anode electrode (p electrode) 22c and cathode electrode (n electrode) 22d are provided at both ends of the top face of nitride semiconductor layers 22b. Wire-bonding part 22e is provided on anode electrode 22C, and wire-bonding part 22f is provided on cathode electrode 22d. For example, in adjacent second LEDs 22, anode electrode 22c of one second LED 22 and cathode electrode 22d of the other second LED 22 are connected by wire 60 via wire-bonding parts 22e and 22f. First LEDs 21 are also configured in the same way as that of second LEDs 22.

As described above, adjacent LEDs 20 (first LEDs 21 or second LEDs 22) are directly connected by wires 60 in light-emitting device 1. In other words, adjacent LEDs 20 are wire-bonded in the chip-to-chip fashion. Alternatively, a land (wiring), which acts as a wire connector, may be provided on substrate 10, and the land and LED 20 may be connected by wire-bonding, without adopting the chip-to-chip connection. However, the chip-to-chip connection can easily achieve higher integration of LEDs 20.

In light-emitting device 1, LEDs 20 are divided to form divided element arrays 20A along a shorter side of substrate 10. However, other arrangements are acceptable. For example, LEDs 20 may be divided to form divided element arrays along a longer side of substrate 10. Still more, divided element arrays may be aligned in any directions.

The number of divided element arrays 20A are not limited to twenty arrays. Divided element arrays 20A also do not always have to form a circle. For example, entire divided element arrays 20A may form rectangular. The number of LEDs 20 in one divided element array 20A may be one or more, and this may be increased to the maximum number depending on the size of substrate 10.

The forward voltage of LEDs 20 on substrate 10 is preferably the same, but the forward voltage of each of LEDs 20 may slightly vary. As long as the total forward voltage of the entire array of LEDs 20 is within a predetermined allowance, variations are acceptable. In other words, variations in the forward voltage of each of first LED arrays 21A and the forward voltage of each of second LED arrays 22A are acceptable as long as they are within the predetermined variation.

[Wiring]

Wirings 30 are formed for supplying power to LEDs 20 (first LEDs 21 and second LEDs 22) mounted on substrate 10. Wirings 30 are conductive members for running current to light LEDs 20. For example, wirings 30 are made of metal. Wirings 30 are electrically connected to LEDs 20 (first LEDs 21 and second LEDs 22), and are also electrically connected to a pair of power supply terminals 71 and 72. This enables to supply predetermined current to LEDs 20 (first LEDs 21 and second LEDs 22) via wirings 30.

Wiring 30 is, for example, formed by etching or printing a metal film. Gold wiring, silver wiring, or copper wiring is typically used as a metal material for wiring 30. Alternatively, wiring made by gold-plating on silver as a base metal may be used.

Wirings 30 are formed in predetermined patterns on the surface of substrate 10. In light-emitting device 1, wirings 30 include first wiring 31, second wiring 32, third wiring 33, fourth wiring 34, and fifth wiring 35.

In first wiring 31, its one end is connected to power supply terminal 71, and its the other end is an open end. The open end of first wiring 31 is disposed between third wiring 33 and fourth wiring 34 in first connector 40A. In other words, first wiring 31 is adjacent to third wiring 33 and fourth wiring 34. In this description, the open end of wiring 30 refers to an end part of wiring 30 that is connected to nowhere.

Light-emitting device 1 has a pair of power supply terminals 71 and 72. First wiring 31 is electrically connected to power supply terminal 71, and second wiring 32 is electrically connected to the first end of first LED array 21A and power supply terminal 72. Still more, fifth wiring 35 is electrically connected to the first end of second LED array 22A, and fourth wiring 34 is electrically connected to the second end of first LED array 21A and the second end of second LED array 22A. Third wiring 3 and fifth wiring 35 are integrally formed.

In second wiring 32, its one end is connected to the first ends of multiple first LED arrays 21A via wires 60, and its other end is connected to power supply terminal 72. More specifically, one end of second wiring 32 is branched to be connected to first LEDs 21 positioned at one furthest end (first end) of each of first LED arrays 21A (twenty first LEDs 21 connected in series). A part of second wiring 32 is adjacent to fifth wiring 35 at least in second connector 40B.

Fifth wiring 35 is connected to the first ends of second LED arrays 22A configured with second LEDs 22 via wires 60. Third wiring 33 and fifth wiring 35, which are integrally formed, are open at both ends, and these wirings are branched in the middle to be connected to the first ends of second LED arrays 22A. More specifically, a part of third wiring 33 and a part of fifth wiring 35 are branched to be connected to second LEDs 22 positioned at one furthest end (first end) of each of second LED arrays 22A (twenty second LEDs 22 connected in series).

The open end of third wiring 33 is adjacent to first wiring 31 in first connector 40A, and the open end of fifth wiring integrally formed with third wiring 33 is adjacent to second wiring 32 in second connector 40B. More specifically, third wiring 33 and fifth wiring 35, which are integrally formed, are disposed at the outermost part of wirings 30, and they are extended to surround a mounting area (light-emitting area) of LEDs 20 from first connector 40A to second connector 40B.

In fourth wiring 34, its one end is connected to the second ends of first LED arrays 21A and the second ends of second LED arrays 22A via wires 60, and its the other end is an open end. The open end of fourth wiring 34 is adjacent to first wiring 31 in first connector 40A.

One end of fourth wiring 34 is branched to be connected to first LEDs 21 positioned at the other outermost end (second end) of each of first LED arrays 21A, and second LEDs 22 positioned at the other outermost end (second end) of each of second LED arrays 22A.

In first connector 40A and second connector 40B, an interval between two adjacent wirings 30 is not particularly limited as long as it is a distance that can be at least wire-bonded.

Parts of wirings 30 exposed from first sealing member 51 and second sealing member 52 are preferably coated with an insulating film, such as a glass film (glass coating film) and insulating resin film (resin coating film). For example, as the resin film, a white resin material (white resist) with high reflectivity of about 98% can be used. To connect wiring 30 and first LED 21 or second LED 22, using wire 60, an opening is created in the insulating film to expose a part of wiring 30 as a wire connector (land). The insulating film is formed on the entire surface of substrate 10 except for this opening.

By coating the entire substrate 10 with the insulating film, such as white resist and glass coating film, a synthesized light emitted from first sealing member 51 can be reflected, and thus the light extraction efficiency of light-emitting device 1 can be improved. Still more, by coating wiring 30 with the insulating film, insulation (insulation strength voltage) of substrate 10 can be improved. Furthermore, oxidization of wiring 30 can be suppressed.

[Connector (Conductive Material, Connection Pad)]

First connector 40A is configured to connect adjacent two wirings 30 in multiple wirings 30, and includes at least one first conductive member 411 and at least one pair of connection pads (wire pads) 42. Each of adjacent two wirings 30 (first wiring 31 and third wiring 33, and first wiring 31 and fourth wiring 34) in first connector 40A has three pairs of connection pads 42.

In the same way, second connector 40 is also configured to connect adjacent two wirings 30 in multiple wirings 30, and has at least a pair of connection pads (wire pads) 42. Adjacent second wiring 32 and fifth wiring 35 in second connector 40 have three pairs of connection pads 42, respectively.

In first connector 40A and second connector 40B, conductive member 41 selectively connects two adjacent wirings in multiple wirings 30, depending on series or parallel connection of first LED array 21A and second LED array 22A. More specifically, conductive member 41 connects at least one pair of connection pads 42 provided on adjacent two wirings 30. This electrically and physically connects adjacent two wirings 30.

For example, when first LED array 21A and second LED array 22A are connected in series, as shown in FIG. 1A, at least one first conductive member 411 electrically connects first wiring 31 and third wiring 33 in first connector 40A. First wiring 31 and fourth wiring 34 are not connected. Still more, second wiring 32 and third wiring 33 are not connected in second connector 40B.

As described above, first LED array 21A may be connected in parallel in multiple arrays (e.g., twelve parallel connections). In the same way, second LED array 22A may be connected in parallel in a group of multiple arrays (e.g., twelve parallel-connections).

First conductive member 411 (conductive member 41) is typically a thin conductive wire, such as a gold wire, and is stretched across at least one pair of protruding connection pads 42 facing each other. First conductive member 411 is sealed by second sealing member 52, and is extended in the same direction as the longer direction of second sealing member 52. Second sealing member seals at least one conductive member on connection pads 42.

First conductive member 411 (conductive member 41) preferably uses a material same as that of wires 60, which is described later. This enables to form conductive members 41 and wires 60 using the same bonder (in the same process), and thus conductive member 41 can be formed without dropping the production efficiency. For example, gold wires with same electric capacitance can be used for conductive members 41 and wires 60.

In first connector 40A, the total number of first conductive members 411 for connecting adjacent wirings 30 is preferably the same or less number of parallel connections in each of first LED arrays 21A and second LED arrays 22A in first LED group 21G and second LED group 22G. The minimum number of parallel connections of LEDs 20 in light-emitting device 1 is twelve, which is the case when twelve first LED arrays 21A connected in parallel are connected in series to twelve second LED arrays 22A connected in parallel. Accordingly, the total number of first conductive members 411 for connecting adjacent two wirings 30 in first connector 40A can be set to twelve or less. In light-emitting device 1, adjacent wirings 30 are connected by nine first conductive members 411. For example, the number of first conductive members 411 can be set to same as the above number of parallel connections or less by using a wire with capacity higher than capacity of current normally applied to LED chips for a wire of first conductive member 411.

In other words, first LED array 21A and second LED array 22A are one of the same number of first LED arrays and second LED arrays, respectively. Multiple first LED arrays 21A are connected in parallel, and multiple second LED arrays 22A are connected in parallel. The total number of at least one first conductive member 411 in first connector 40A can be set to the number of parallel connections or less.

In the same way, the total number of conductive members 41 can be set to the number of parallel connections or less when first wiring 31 and fourth wiring 34 are connected by at least one conductive member 41 in first connector 40A, or when second wiring 32 and fifth wiring 35 are connected in second connector 40B.

In addition, each of connection pads 42 is provided in each of adjacent two wirings 30 in first connector 40A. More specifically, at least one pair of protruding connection pads 42 facing each other is provided between adjacent two wirings 30 (first wiring 31 and third wiring 33, or first wiring 31 and fourth wiring 34) and connected to wirings 30. Each connection pad 42 can be typically configured with conductive material, such as metal including gold (gold pad).

In the same way in second connector 40B, at least one pair of protruding connection pads 42 facing each other is provided between adjacent two wirings 30 (second wiring 32 and fifth wiring 35).

In first connector 40A and second connector 40B, at least one pair of connection pads 42 is connected such that one connection pad 42 and the other connection pad 42 are connected by conductive member 41. More specifically, a pair of connection pads 42 is wire-bonded by conductive member 41 configured with at least one wire. This electrically connects two wirings 30 facing each other.

At least three pairs of connection pads 42 are provided between each of adjacent two wirings 30 in first connector 40A and second connector 40B. In addition, in first connector 40A, each of the pairs of connection pads 42 is connected by at least one first conductive member 411. More specifically, each of the pairs of connection pads 42 is connected by three gold wires. By forming multiple conductive members 41 (wires) on one pair of connection pads 42, the number of connection pads 42 can be reduced. An area of connection pads 42 on the substrate can thus be reduced. Furthermore, second sealing member 52 seals three gold wires (first conductive members 411) in each pair of connection pads 42.

A pair of connection pads 42 is connected by conductive member 41 to connect adjacent two wirings 30. However, connection pads 42 may not be provided. In this case, adjacent two wirings 30 are directly connected by conductive member 41.

In first connector 40A, a bonding distance of first conductive members 411 (wires) can be set to, for example, from 0.5 mm or more to 3.0 mm or less. The bonding distance of first conductive member 41 is 0.8 mm. This is same for other conductive members 41 in first connector 40A and second connector 40B.

[First Sealing Member]

First sealing member 51 is formed on substrate 10 so as to cover first LEDs 21 and second LEDs 22. By sealing first LEDs 21 and second LEDs 22 by first sealing member 51, first LEDs 21 and second LEDs 22 can be protected. First sealing member 51 also seals wires 60.

First sealing member 51 is linearly formed to integrally seal LEDs 20 in each divided element array 20A. In other words, first sealing member 51 is formed for the number of divided element arrays 20A of LEDs 20. More specifically, twenty first sealing members 51 are formed in parallel to each other. In light-emitting device 1, each of twenty first sealing members 51 is parallel to the shorter side of substrate 10.

In this way, first sealing members 51 are linearly formed to cover all LEDs 20 in each divided element array 20A along the direction (alignment direction) of LEDs 20. Therefore, each of first sealing members 51 integrally seals each divided element array 20A. In other words, first LEDs 21 of one first LED array 21A and first LEDs 21 of another first LED array 21A may be included in one divided element array 20A. Still more, second LEDs 22 of one second LED array 22A and second LEDs 22 of another second LED array 22A may be included. Furthermore, first LEDs 21 of first LED array 21A and second LEDs 22 of second LED array 22A may be included. This means, even if LEDs 20 of different series element arrays (first LED array 21A and second LED array 22A) are included in one divided element array 20A, LEDs 20 of different series element arrays are integrally sealed together. In other words, first LEDs 21 of one first LED array 21A may be included in adjacent divided element arrays 20A, or second LEDs 22 of one second LED array 22A may be included in adjacent divided element arrays 20A.

The length of each first sealing member 51 is adjusted to form a circle as a whole by twenty first sealing members 51. However, first sealing members 51 do not have to form a circle as a whole. For example, first sealing members 51 may form rectangular as a whole.

First sealing member 51 is mainly configured with a translucent material. To convert light wavelengths of first LEDs 21 and second LEDs 22 to a predetermined wavelength, a wavelength converting member is mixed in first sealing member 51 (translucent material). In this case, first sealing member 51 contains phosphor as the wavelength converter, and functions as a wavelength converting member for converting wavelengths (colors) of lights emitted from first LEDs 21 and second LEDs 22. For example, an insulating resin material that contains phosphor particles (phosphor-containing resin) is used for first sealing member 51. Phosphor particles are excited by lights emitted from first LEDs 21 and second LEDs 22, and discharge light with predetermined color (wavelength).

As a resin material configuring first sealing member 51, for example, silicon resin can be used. In addition, an optical diffuser may be dispersed in first sealing member 51. First sealing member 51 does not necessarily be formed by resin material. An organic material, such as fluorinated resin, or inorganic material, such as glass with low melting point and sol-gel glass, may be used for forming first sealing member 51.

As phosphor particles mixed in first sealing member 51, for example, YAG (yttrium aluminium garnet) yellow phosphor particles can be used for obtaining white light when first LEDs 21 and second LEDs 22 are blue LED chips that emit blue light. As a result, yellow phosphor particles contained in first sealing member 51 converts wavelength of a part of blue light emitted from first LEDs 21 and second LEDs 22 to yellow light. Then, the blue light not absorbed by yellow phosphor particles and the yellow light generated by converting wavelength by yellow phosphor particles are mixed in first sealing member 51, and white light is discharged from first sealing member 51. As an optical diffuser, silica particles are typically used.

In the above case, first sealing member 51 is phosphor-containing resin in which predetermined yellow phosphor particles are dispersed in silicon resin. The phosphor-containing resin is applied to the main face of substrate 10 using a dispenser, so as to integrally seal LEDs 20 in each divided element array 20A. Then, the resin is cured to form first sealing member 51.

This process is described in more details below. A dispensing nozzle of the dispenser is disposed facing a predetermined position on substrate 10. Then, the dispensing nozzle is moved from one end to the other end of the divided element array while the sealing material (phosphor-containing resin before curing) is dispensed from the dispensing nozzle. Here, the sealing material is dispensed such that it covers LEDs 20 and also wires 60.

First sealing member 51 applied and formed in this way is tubular, and its cross section perpendicular to the longer direction of first sealing member 51 is, for example, practically semi-circle.

A line pitch (center-to-center distance) of first sealing member 51 can be set to, for example, from 1.4 mm or more to 3.0 mm or less. The line pitch of first sealing member 51 is, for example, 1.8 mm. A sealing width (line width) of first sealing member 51 is, for example, 1.5 mm.

[Second Sealing Member]

On the other hand, second sealing member 52 is formed on substrate 10 to cover conductive members 41, which are wires. By sealing conductive members 41 with second sealing member 52, conductive members 41 can be protected.

Second sealing member 52 is linearly formed to cover conductive members 41, connection pads 42, and wirings 30 in first connector 40A and second connector 40B. Second sealing member 52 is formed on each of pairs of connection pads 42.

For example, since three conductive members 41 are provided in one connection pad 42, one second sealing member 52 is formed to integrally cover three conductive members 41. In one first connector 40A and second connector 40B, three pairs of connection pads 42 are provided between adjacent two wirings 30. Therefore, three second sealing members, in total, are formed between adjacent two wirings 30 of each pair of connection pads 42. In other words, multiple conductive members 41 can be sealed in every pair of connection pads.

Second sealing member 52 can be configured with, for example, an insulating resin material. As second sealing member 52, a material same as that for first sealing member 51 that seals LEDs 20 can be used. In light-emitting device 1, the phosphor-containing resin, in which yellow phosphor particles are dispersed in silicon resin, is used for first sealing member 51. Therefore, the same phosphor-containing resin is used for second sealing member 52.

By configuring first sealing members 51 and second sealing members 52 using the same material, first sealing member 51 and second sealing member 52 can be formed in the same process. More specifically, first sealing member 51 and second sealing member 52 can be formed by consecutive application using the same dispensing nozzle. This achieves the line width (sealing width) of second sealing member 52 almost same as that of first sealing member 51.

A line pitch (center-to-center distance) of second sealing member 52 can be set to, for example, from 1.4 mm or more to 3.0 mm or less. For example, the line pitch of second sealing member 52 is 2.8 mm, which is greater than that of first sealing member 51. The line width of second sealing member 52 is 1.5 mm, which is same as that of first sealing member 51.

Second sealing member 52 may be made of a material different from first sealing member 51. Still more, all conductive members 41 (e.g., nine conductive members 41) may be integrally sealed with one second sealing member 52 in first connector 40A and second connector 40B.

Light-emitting device 1 shows an example of forming second sealing member 52. However, second sealing member 52 may not be formed. In this case, conductive members 41 and connection pads 42 remain exposed.

(Wire)

Wires 60 are a thin conductive wires for electrically connecting first LEDs 21 or second LEDs 22 and wirings 30. For example, it is a gold wire. As described above, wire 60 directly connects adjacent two LEDs 20. Wire 60 is preferably embedded in first sealing member 51 so as not to expose from first sealing member 51.

In addition, wire 60 is extended in the direction same as the longer direction of first sealing member 51. In other words, all wires 60 in first LED array 21A (twenty first LEDs 21 connected in series) and second LED array 22A (twenty second LEDs 22 connected in series) are linearly provided in a plan view.

By configuring conductive members 41 and wires 60 with the same material, they can be extended using the same bonder. This enables to wire-bond pairs of connection pads 42 in the same process as the wire-bonding process of LEDs 20.

[Power Supply Terminal]

A pair of power supply terminals 71 and 72 is external connecting terminals (electrode terminals) for receiving predetermined power from outside light-emitting device 1 (an external power source). Light-emitting device 1 is connected to a single power source, and thus power is supplied to first LED arrays 21A (first LEDs 21) and second LED arrays 22A (second LEDs 22) from the same power source via the pair of power supply terminals 71 and 72.

To emit light from LEDs 20 (first LEDs 21 and second LEDs 22), power supply terminals 71 and 72 receive DC power from the power source, and supply received DC power to each LED 20 via wirings 30 and wires 60.

For example, one power supply terminal 71 is a low-voltage power supply terminal, and the other power supply terminal 72 is a high-voltage power supply terminal.

Power supply terminals 71 and 72 may be a socket type. In this case, power supply terminals 71 and 72 are configured with a resin socket and conductive part (conductive pin) for receiving DC power. The conductive part is electrically connected to wirings 30 formed on substrate 10. For example, one end of connector line (harness) whose the other end is typically connected to external power source is attached to the socket. This structure enables to receive power supply from the external power source via power supply terminals 71 and 72 via the connector line.

Other than the socket type, power supply terminals 71 and 72 may also be metal electrodes (metal terminals) configured typically with gold (Au) patterned in a rectangular shape.

[Relationship of LED Connection]

Figure 3:
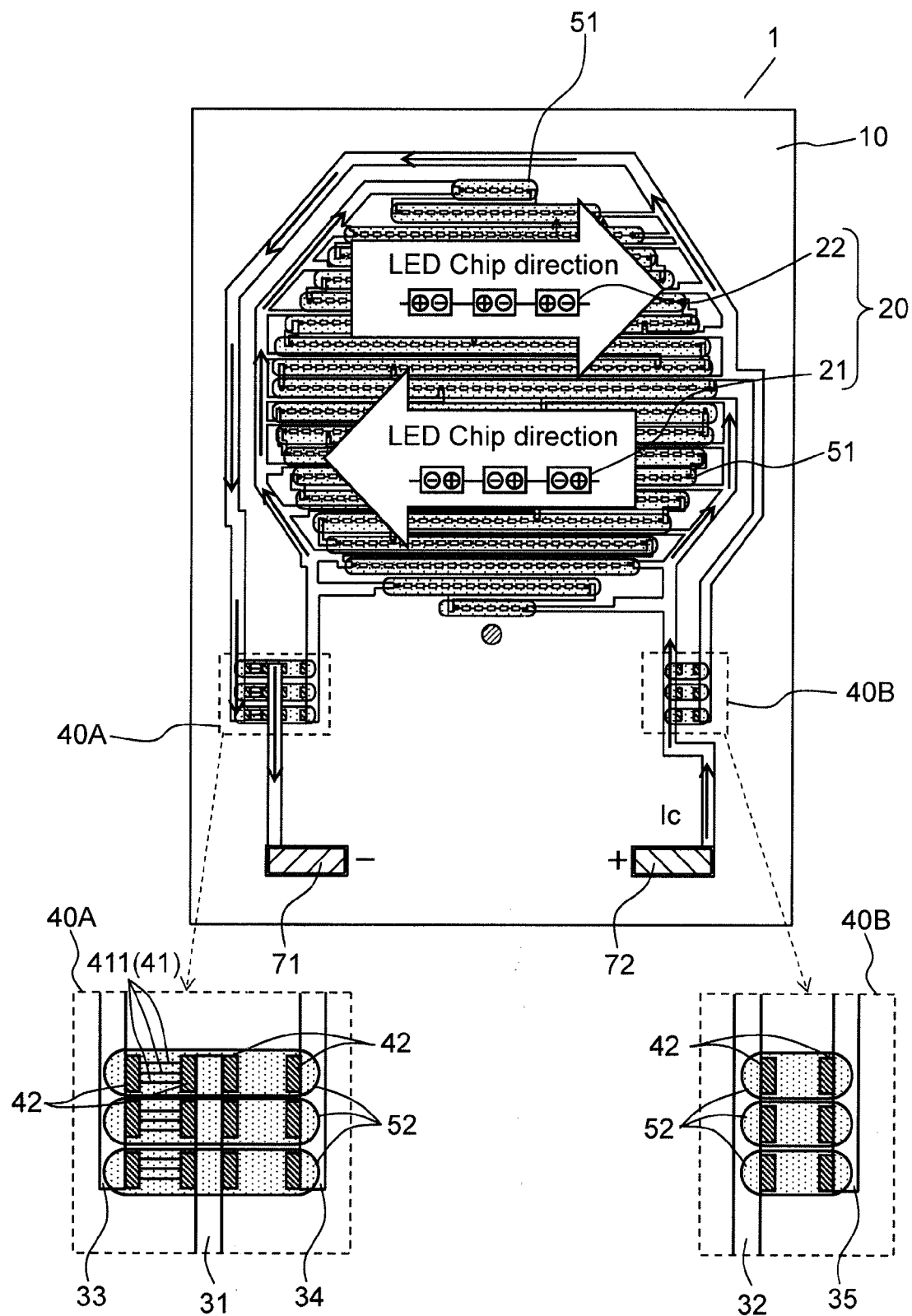
FIG. 3 is a plan view of the light-emitting device in FIG. 1A when series connection is adopted.
Figure 4A:
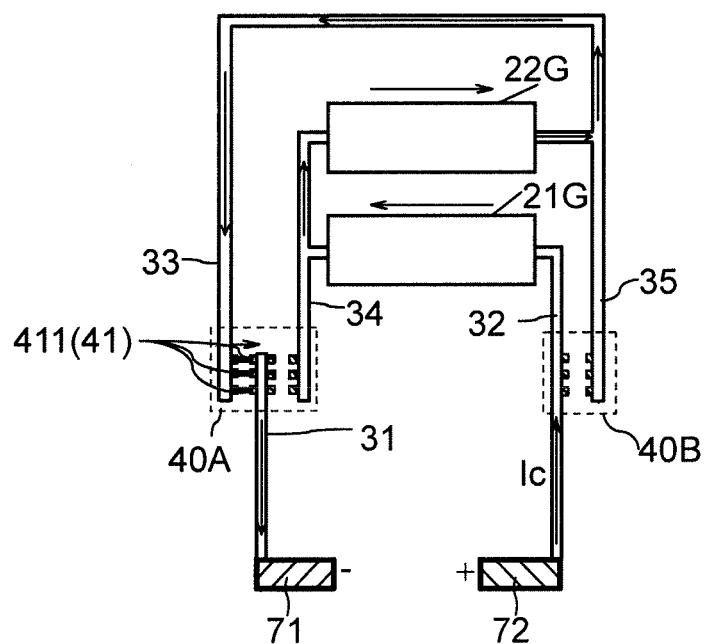
FIG. 4A is a schematic view illustrating a flow of current in the light-emitting device in FIG. 3.
Figure 4B:
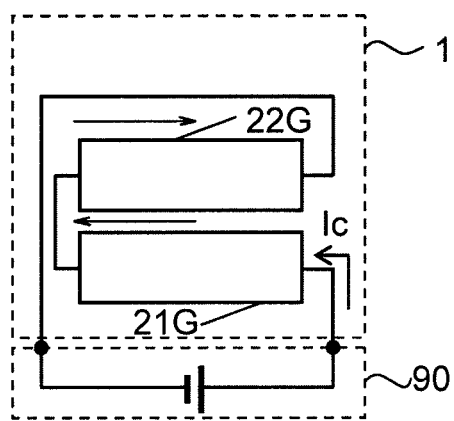
FIG. 4B is an electric diagram of the light-emitting device in FIG. 3.
Figure 5:
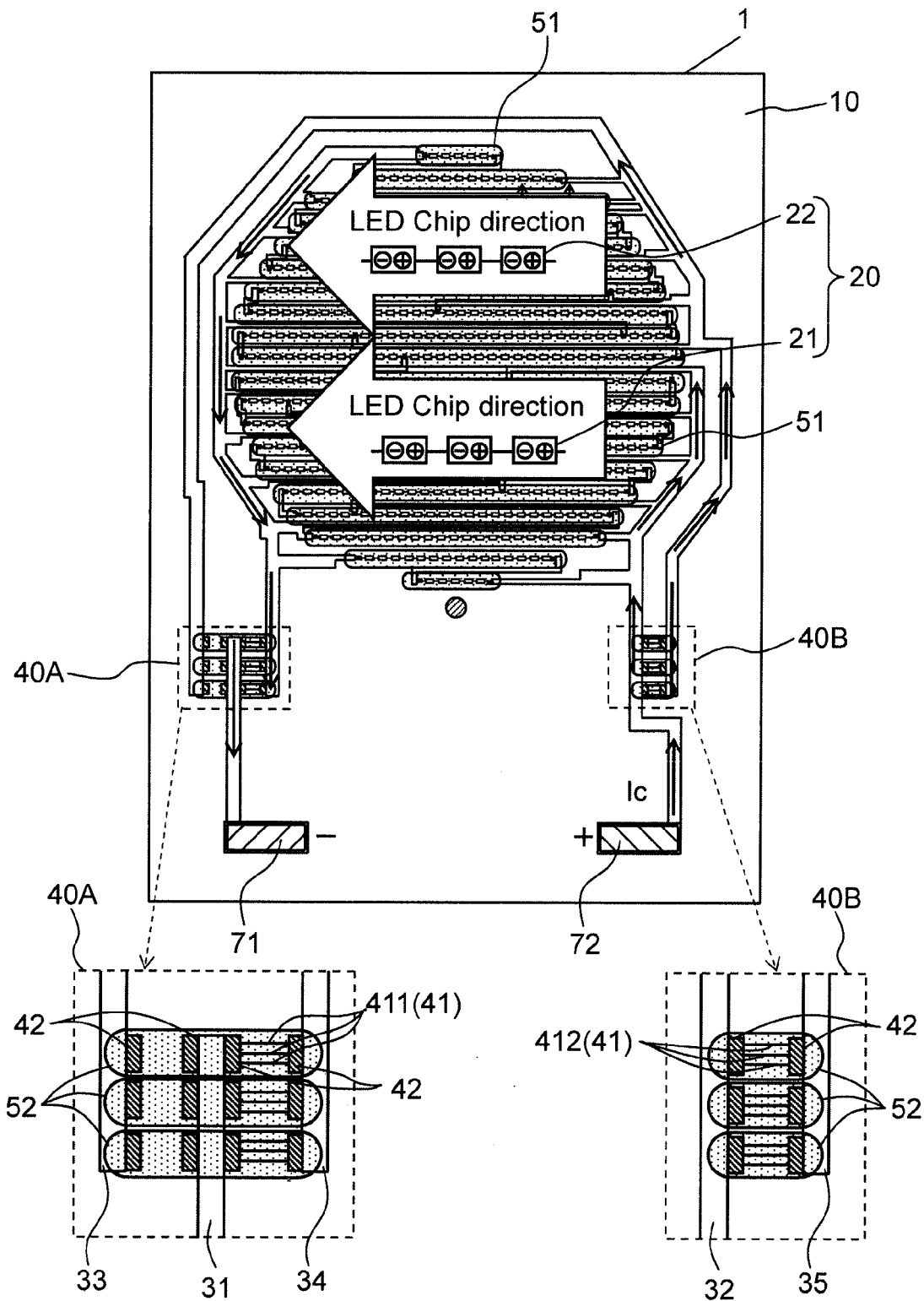
FIG. 5 is a plan view of the light-emitting device in FIG. 1A when parallel connection is adopted.
Figure 6A:
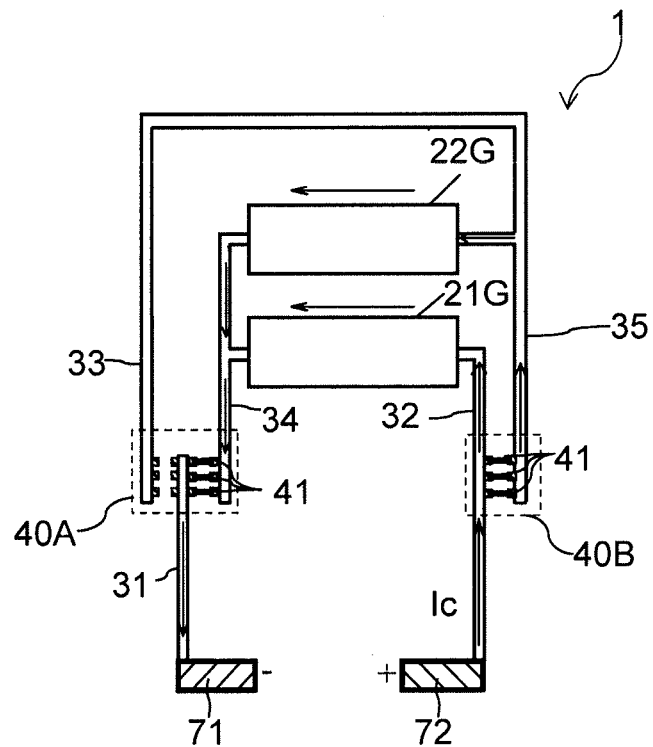
FIG. 6A is a schematic view illustrating a flow of current in the light-emitting device in FIG. 5.
Figure 6B:
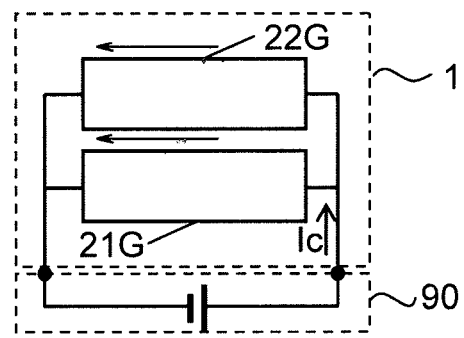
FIG. 6B is an electric diagram of the light-emitting device in FIG. 5.

Next, connection of LEDs 20 is described with reference to FIGS. 3 to 6B. FIG. 3 is a plan view of light-emitting device 1 adopting series connection. FIG. 4A is a schematic view illustrating the flow of current in light-emitting device 1 in FIG. 3. FIG. 4B is an electric diagram of light-emitting device 1 in FIG. 3. FIG. 5 is a plan view of light-emitting device 1 adopting parallel connection. FIG. 6A is a schematic view illustrating the flow of current in light-emitting device 1 in FIG. 5. FIG. 6B is an electric diagram of light-emitting device 1 in FIG. 5.

Next is described the case when first LED group 21G configured with twelve first LED arrays 21 connected in parallel is connected in series to second LED group 22G configured with twelve second LED arrays 22A connected in parallel, with reference to FIGS. 3, 4A, and 4B.

More specifically, as shown in FIG. 3, LEDs 20 are aligned such that the alignment direction (chip direction) of first LEDs 21 in first LED array 21A (twenty first LEDs 21 connected in series) and the alignment direction of second LEDs 22 in second LED array 22A (twenty second LEDs 22 connected in series) are opposite when seen from the top. For example, each of LEDs 20 (first LEDs 21 and second LEDs 22) form a rectangular shape when seen from the top. Their anode electrodes (+) are positioned toward one shorter sides of LEDs 20, and their cathode electrodes (−) are positioned toward the other shorter sides of LEDs 20. The opposite directions when seen from the top mean that positions of anode electrodes (+) and cathode electrodes (−) are opposite.

More specifically, in light-emitting device 1, first LEDs 21 are aligned such that their anode electrodes (+) are positioned toward second wiring 32 (the side of power supply terminal 72) in first LED array 21A. On the other hand, second LEDs 22 are aligned such that their anode electrodes (+) are positioned toward fourth wiring 34 (the side of power supply terminal 71) in second LED array 22A.

Furthermore, a specific pair in adjacent two wirings 30 in first connector 40A and second connector 40B is connected by conductive member 41 to achieve series connection of first LED array 21A and second LED array 22A.

More specifically, in first connector 40A, first wiring 31 and third wiring 33 are electrically connected by at least one first conductive member 411, and first wiring 31 and fourth wiring 34 are not connected. In second connector 40B, second wiring 32 and fifth wiring 35 are not connected.

As shown in FIGS. 4A and 4B, this achieves series connection of first LED array 21A and second LED array 22A. For example, when power circuit 90 for supplying rated current Ic to light-emitting device 1 is connected, current Ic runs in first LED group 21B and second LED group 22G. Then, forward current Ic/12 runs in each of LEDs 20 (first LEDs 21 and second LEDs 22).

Next is described the case when first LED group 21G configured with twelve first LED arrays 21A connected in parallel is connected in parallel to second LED group 22G configured with twelve first LED arrays 22A connected in parallel, with reference to FIGS. 5, 6A, and 6B.

More specifically, as shown in FIG. 5, first LEDs 21 in first LED array 21A and second LEDs 22 in first LED array 22A may be aligned in the same alignment directions.

In light-emitting device 1, first LEDs 21 are aligned such that their anode electrodes (+) are positioned toward second wiring 32 (the side of power supply terminal 72) in first LED array 21A, and second LEDs 22 are aligned such that their anode electrodes (+) are also positioned toward second wiring 32 (the side of power supply terminal 72).

Furthermore, adjacent two wirings 30 in first connector 40A and second connector 40B are connected by conductive member 41 or not connected so as to achieve parallel connection of first LED array 21A and second LED array 22A.

More specifically, in first connector 40A, first wiring 31 and fourth wiring 34 are electrically connected at least by one first conductive member 411, and first wiring 31 and third wiring 33 are not connected. In second connector 40B, second wiring 32 and fifth wiring 35 are electrically connected by at least one second conductive member 412.

As shown in FIGS. 6A and 6B, this achieves parallel connection of first LED array 21A and second LED array 22A. For example, when power circuit 90 for supplying rated current Ic to light-emitting device 1 is connected, current Ic/2 runs in first LED group 21G and second LED group 22G. Then, shunt current of current Ic runs in each of LEDs 20 (first LEDs 21 and second LEDs 22). Then, forward current Ic/24 runs in each of LEDs 20 (first LEDs 21 and second LEDs 22).

The directions of first LEDs 21 and second LEDs 22 are changed between the case of series connection and the case of parallel connection of first LED array 21A and second LED array 22A. However, alignment is not limited. For example, when first LED array 21A and second LED array 22A are connected in series, directions of first LEDs 21 and second LEDs 22 are opposite in the above description, but they may be aligned in the same directions.

More specifically, positions of forming electrodes in first LEDs 21 and second LEDs 22 are determined so as to avoid linear alignment (alignment direction of LEDs 20) of anode electrodes (+) and cathode electrodes (−) of first LEDs 21 and second LEDs 22. Alternatively, directions of first LEDs 21 and second LEDs 22 are determined (e.g., oblique) so as to avoid linear alignment of wires 60 by oblique wire-bonding.

[Method of Manufacturing Light-Emitting Device]

Figure 7:
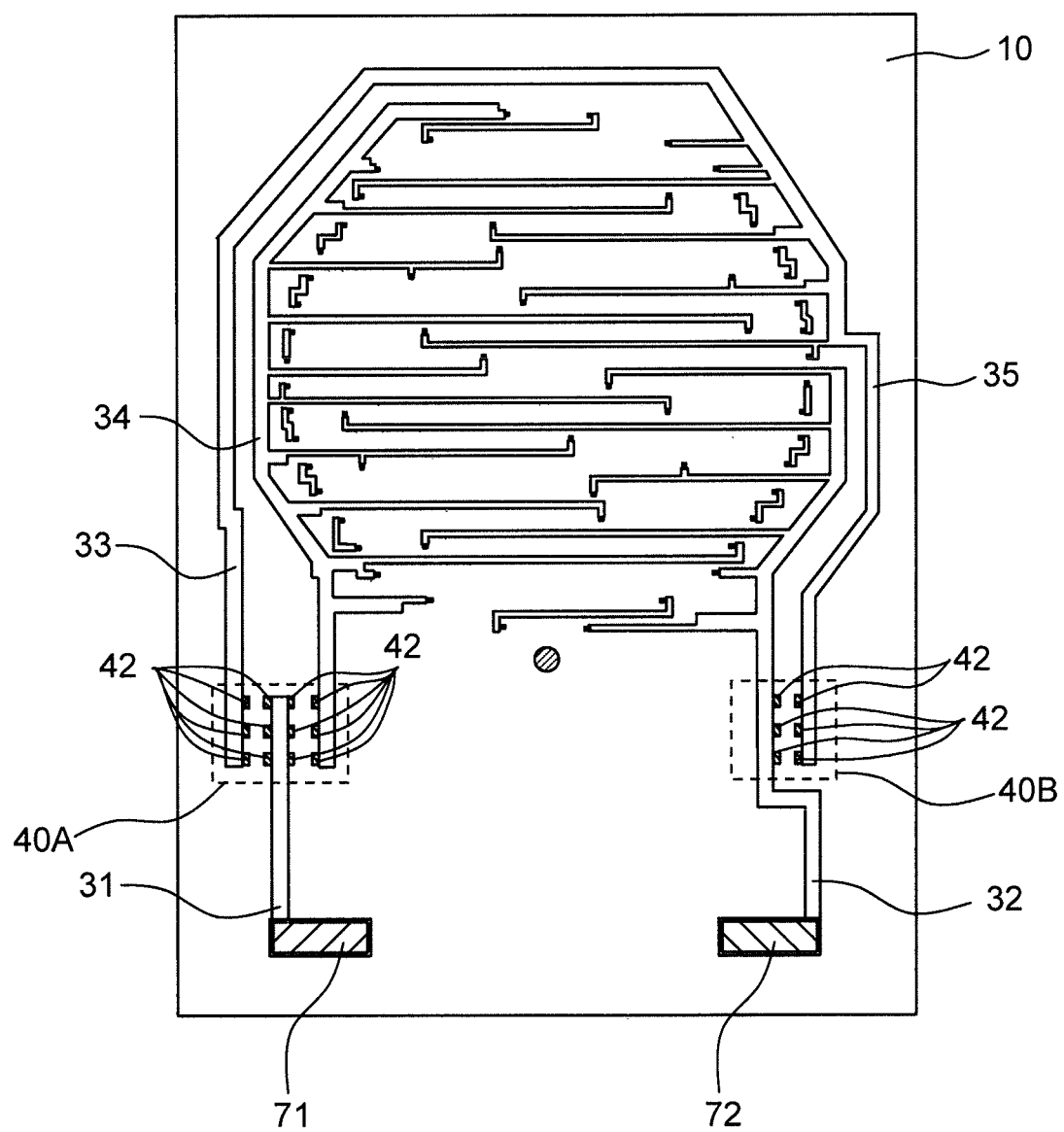
FIGS. 7 to 9 are plan views of processes in a method of manufacturing the light-emitting device in FIG. 1A.
Figure 8:
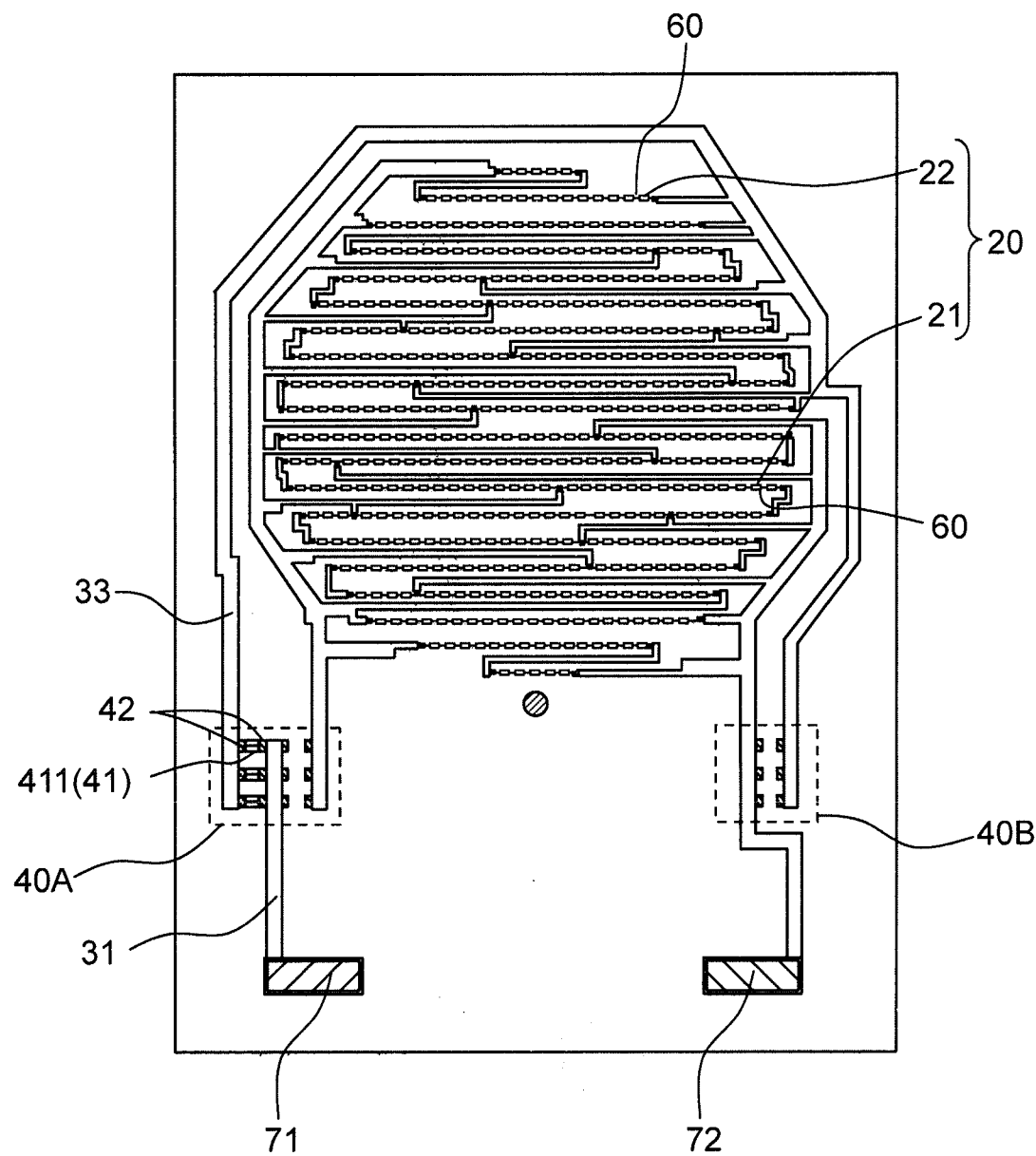
Figure 9:
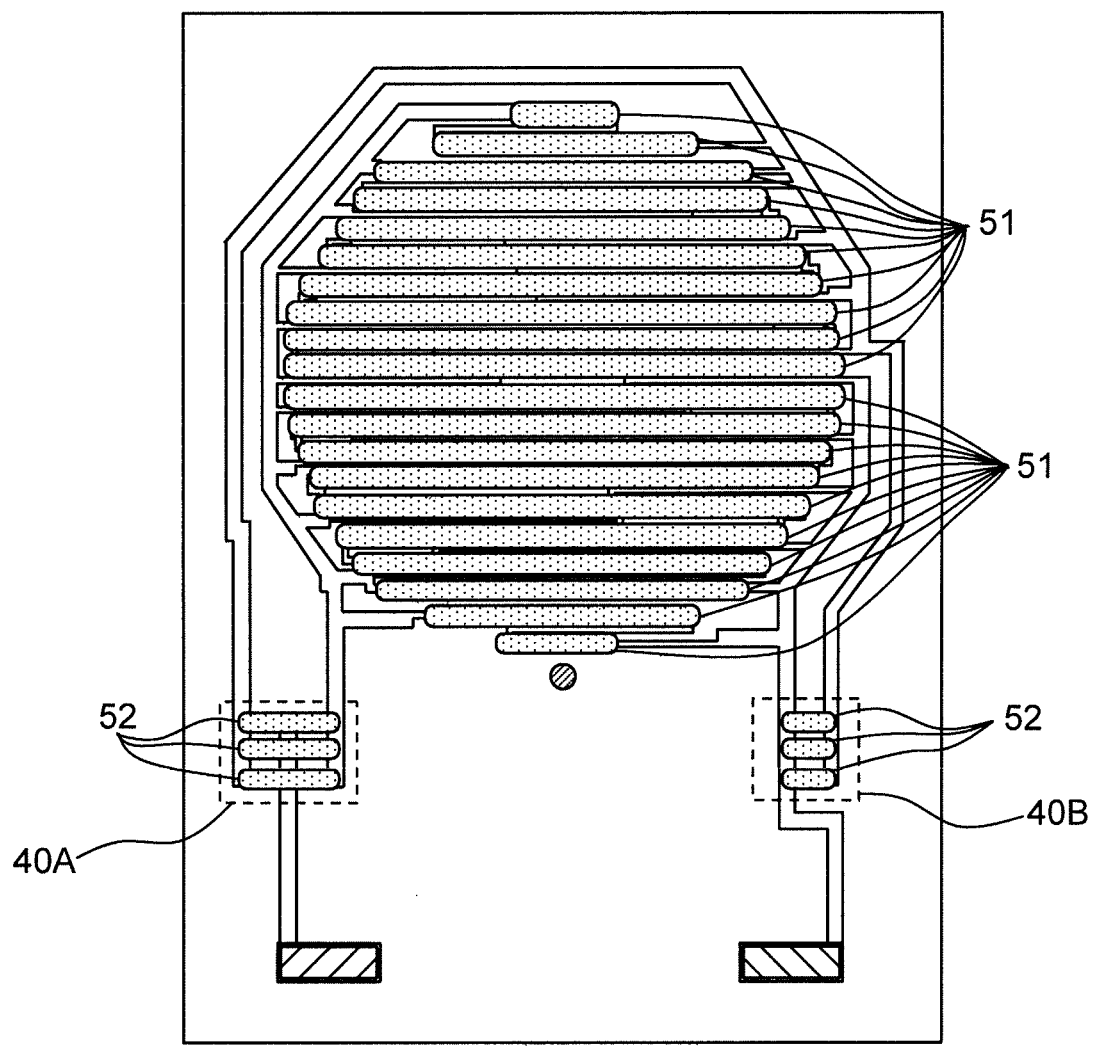

Next, the method of manufacturing light-emitting device 1 is described with reference to FIGS. 7 to 9. FIGS. 7 to 9 are plan views of each process of the method of manufacturing light-emitting device 1.

As shown in FIG. 7, as a mounting substrate, substrate 10 is prepared to form wirings 30 with predetermined pattern, power supply terminals 71 and 72, and connection pads 42 in first connector 40A and second connector 40B. As required, an insulating film, such as white resist, may be formed on the surface of substrate 10.

Next, depending on predetermined specifications of light-emitting device 1, series connection or parallel connection is selected for first LED array 21A and second LED array 22A. Then, LEDs 20 are aligned to achieve selected connection. LEDs 20 or LEDs 20 and wirings 30 are then wire-bonded by wires 60, and adjacent two wirings 30 in first connector 40A and second connector 40B are connected by conductive members 41.

For example, when first LED array 21A and second LED array 22A are connected in series, LEDs 20 are mounted as shown in FIG. 8. Then, LEDs 20 or LEDs 20 and wirings are wire-bonded by wires 60, and first wiring 31 and third wiring 33 in first connector 40A are wire-bonded by first conductive member 41 (wire). By forming first conductive members 411 using the same wire bonder as wires 60, conductive member 41 can be formed without degrading productivity.

Next, as shown in FIG. 9, linear first sealing member 51 is formed for sealing LEDs 20 (first LEDs 21 and second LEDs 22) in units of divided element arrays 20A and wires 60.

Then, second sealing member 52 is formed across a pair of connection pads 42 in first connector 40A and second connector 40B. Here, by using the same material for first sealing member 51 and second sealing member 52, first sealing member 51 and second sealing member 52 can be formed in the same process.

Alternatively, second sealing member 52 may be formed to seal only conductive member 41 and connection pad 42 connected to conductive member 41. However, if second sealing member 52 is formed on all areas where conductive member 41 is possibly formed, there is no need to change areas to form second sealing member 52 depending on specifications for light-emitting device 1. In other words, a common machine program can be used for applying second sealing member 52 by a dispenser.

[Effects]

Next, effects of light-emitting device 1 is described, including background to the disclosure.

Higher luminous flux has been demanded in LED modules for lighting. In particular, an LED module with high luminous flux is demanded in lighting apparatuses, such as for high ceiling, outdoor, and floodlight. More specifically, for example, an LED module for LED bulb with about input power of 4 to 5 W has been demanded. In addition, LED modules with high luminous flux of 100 W or more input power has been demanded.

To achieve such high luminous flux LED modules, the size of substrate for mounting LEDs may be enlarged to increase the number of LEDs mounted.

In this case, however, a problem of multi-shadow occurs if many LEDs (SMD-type LED elements) are placed on the substrate when the LED module has the SMD structure, in addition to the problem of enlarged LED module.

Therefore, high-density placement of many LEDs (LED chips) is considered, using COB-type LED module. In case of COB-type LED module, all LED chips mounted are integrally sealed by a sealing member (e.g., phosphor-containing resin), and thus the problem of multi-shadow that causes many shadows on the irradiated area does not occur.

However, if many LED chips are used, the chip mounting area becomes large, and thus an area to form the sealing member for integrally sealing LED chips (sealing area) also becomes large. As a result, a deformation level of the entire sealing member increases because thermal deformation at the center and periphery of the sealing member differs. This causes a problem of increased internal stress in the sealing member. In addition, thermal distribution becomes uneven at the center and periphery of the sealing member if the sealing area is enlarged. This also causes a problem of different internal stresses, depending on parts of the sealing member.

If many LED chips are used, the number of wires for applying current to LED chips also increases. If an influence of internal stress increases due to enlarged sealing area, as described above, a risk of disconnection of wires increases. As a result, reliability of LED module decreases.

On the other hand, allowable operating voltage of LED modules differs, as described above, depending on destinations, (foreign countries, etc.), purposes of use, and specifications based on their laws and standards. In this case, alignment of LEDs to be mounted need to be changed or wiring patterns need to be changed based on each specification. Low volume production of a wide variety of substrates, which is just one component in LED module, increases the price. The price of LED module thus also increases.

In particular, the unit price of high luminous flux LED module is high, and thus low volume production of a wide variety of LED modules (substrates) further increases the cost.

Also with respect to the LED module, low volume production of a wide variety of substrates requires increased man-hour in order to assess reliability of the LED module. This may degrade reliability or accuracy of life prediction.

The subject matter is devised based on the above knowledge. The primary objective is to suppress cost increase due to difference in allowable voltages. In other words, multiple different specifications can be supported by enabling to select connection (series connection or parallel connection) of LEDs on a single-type of substrate at the time of production.

Still more, the secondary objective is to suppress the influence of sealing member even if the sealing area of sealing member is enlarged. The shape of sealing member is thus considered.

To achieve the primary objective, wirings 30 on substrate 10 are formed in multiple separate groups in advance in light-emitting device 1. First LED array 21A and second LED array 22A are connected in series or parallel by connecting or not connecting these wirings 30 by conductive members 41, depending on specifications for light-emitting device 1. With this structure, series connection or parallel connection of first LED array 21A and second LED array 22A can be selected. Accordingly, multiple different specifications can be supported, using a single type of substrate 10.

Still more, connection or non-connection of adjacent two wirings 30 can be selected in predetermined first connector 40A and second connector 40B. This structure facilitates selection of series connection or parallel connection of LEDs 20.

To achieve the secondary objective, LEDs 20 mounted on substrate 10 are divided into divided element arrays, and LEDs 20 are sealed in units of divided element arrays 20A by first sealing members 51. In other words, multiple first sealing members 51 configure the sealing area.

With this structure, separate multiple first sealing members 51 are segmented and formed substantially perpendicular to the alignment direction of LEDs 20. Stress concentration on first sealing members 51 in the substantially perpendicular direction can be eased to suppress internal stress. In addition, the internal stress of first sealing member 51 in each divided element array 20A can be equalized.

In addition, in comparison of the sealing area when entire LEDs on the substrate are integrally sealed and the sealing area when LEDs 20 are sealed in units of divided element array 20A, as in light-emitting device 1, the sealing area for separately sealing each divided element array 20A is smaller. Deformation of first sealing member 51 can thus be suppressed, compared to the case of integrally sealing all LEDs 20. Accordingly, the internal stress of first sealing member 51 can be eased.

By dividing sealing member to multiple groups in this way, the internal stress of first sealing member 51 can be suppressed and equalized. A risk of disconnection of wires 60 can thus be reduced. This enables to achieve a highly-reliable light-emitting device.

Still more, thermal deformation of first sealing member 51 in the substantially perpendicular direction can be reduced by dividing the sealing member to multiple first sealing members 51. Therefore, thermal deformation of multiple first sealing members 51 as a whole can be reduced. In addition, heat release can be improved, compared to the case of integrally sealing all LEDs 20, by dividing the sealing area to multiple first sealing members 51. This further reduces thermal deformation of the sealing area (first sealing members 51). Better heat release also suppresses reduction of light-emission efficiency of LEDs 20. As a result, the light-emitting device suitable for higher luminous flux can be easily achieved.

If all LEDs 20 are integrally sealed by one sealing member, the surface of sealing member becomes flat and causes total reflection. This degrades the light extraction efficiency. However, by dividing the sealing area into multiple first sealing members 51, as in light-emitting device 1, the surface of each first sealing member 51 can be curved. Accordingly, the optical transmission efficiency can be improved, compared to the case of integrally sealing all LEDs 20.

Still more, LEDs 20 are divided into multiple divided element arrays 20A, and first sealing member 51 is formed on each divided element array 20A. This makes a light-emitting part (first sealing member 51) same in all arrays. Therefore, the entire light-emitting area can be evaluated just by evaluating one array of light-emitting part (first sealing member 51). This enables to efficiently predict service life, and also suppress degradation of accuracy of life prediction. The reliability can also be easily determined.

Even if the sealing area is configured with multiple first sealing members 51, a problem of multi-shadow does not occur.

As described above, light-emitting device 1 and substrate 10, on which wirings 30 are formed, enable to select series connection or parallel connection. The sealing area is divided into multiple areas. This achieves a highly-reliable light-emitting device with high light extraction efficiency even if the number of LEDs is increased to achieve higher luminous flux.

Still more, same material as first sealing member 1 for sealing LEDs 20 (first LEDs 21 and second LEDs 22) is used for second sealing member 52 for sealing conductive members 41.

This enables to seal conductive members 41 in the same way as that for sealing LEDs 20 (LED chips). Therefore, second sealing member 52 can be easily formed, and the reliability can also be verified in a simplified manner.

Still more, the width of first sealing member 51 and the width of second sealing member 52 are almost the same. In other words, a cross-sectional shape (cross-section area) of first sealing member 51 and a cross-sectional shape (cross-section area) of second sealing member 52 are almost identical. Therefore, each pair of connection pads 42 is sealed with second sealing member 52 instead of integrally sealing multiple pairs (e.g. three pairs) of connection pads 42 with second sealing member 52 in first connector 40A and second connector 40B.

This enables to unify internal stress in the entire sealing members including first sealing member 51 and second sealing member 52. In addition, since the internal stresses of first sealing member 51 (light-emitting area) and second sealing member 52 (wiring connection area) become the same, risks of disconnection of wires 60 and conductive members 41 (wires) also become the same. Accordingly, a highly-reliable light-emitting device can be achieved.

Still more, in first connector 40A and second connector 40B, the total number of conductive members 41 for mutually connecting adjacent wirings 30 is set to not greater than the number of minimum parallel connections of LEDs 20.

If the mounting number of LEDs 20 increases, due to higher luminous flux of the light-emitting device, the number of parallel connections of LEDs 20 also increases and current applied to light-emitting device 1 also increases. Therefore, the total number of conductive members 41 is preferably set to not greater than the minimum parallel connections of LEDs 20.

Still more, the connection wiring area (second sealing member 52) is preferably away from light-emitting area (first sealing member 51).

If the connection wiring area is close to the light-emitting area, light enters again from the light-emitting area (first sealing member 51) to connection wiring area (second sealing member 52). This degrades light emission efficiency and causes color unevenness in the irradiated area. Contrarily, by setting the connection wiring area away from the light-emitting area, degradation of light emission efficiency or generation of color unevenness in the irradiated area can be suppressed.

Figure 10B:
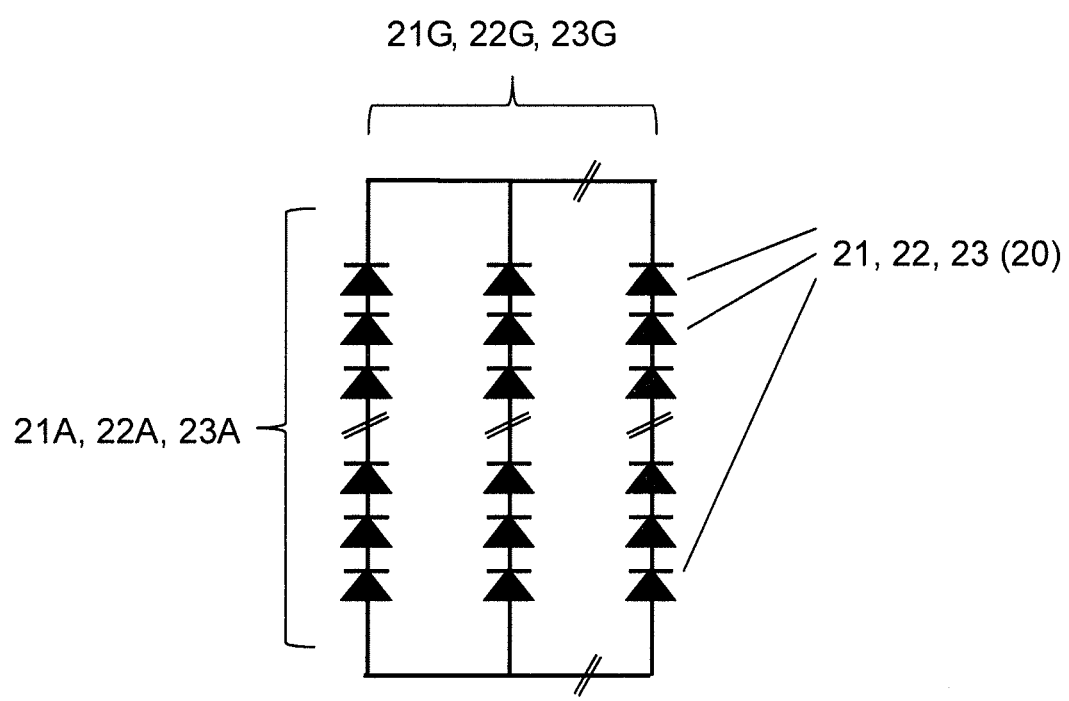
FIG. 10B is a connecting diagram of a light-emitting element in the light-emitting device in FIG. 10A.

Next is described light-emitting device 2, which is another light-emitting device in the exemplary embodiment, with reference to FIGS. 10A to 12B. FIG. 10A illustrates a wiring pattern of light-emitting device 2. FIG. 10B is a connecting diagram (circuit diagram) of LEDs 20 in light-emitting device 2.

Light-emitting device 2 further includes multiple third LEDs 23 in LEDs 20, and sixth wirings 36 in multiple wirings 30, relative to light-emitting device 1.

Same as light-emitting device 1, LEDs 20 on substrate 10 are configured with multiple element arrays. In other words, all LEDs 20, including third LEDs 23, are divided into element arrays.

Third LEDs 23 mounted on substrate 10 are connected in series in units of multiple LEDs. For example, in the same way as first LED arrays 21A and second LED arrays 22A, twenty third LEDs 23 connected in series form third LED array 23A, and twelve third LED arrays 23A are connected in parallel to configure third LED group 23G.

As third LEDs 23, LEDs 20 can be used, same as first LEDs 21 and second LEDs 22. Also same as first LEDs 21 and second LEDs 22, third LEDs 23 are configured with multiple divided element arrays 20A. First sealing member 51 is formed on each divided element array 20A.

Also in light-emitting device 2, wirings 30 include first wiring 31, second wiring 32, third wiring 33, fourth wiring 34, fifth wiring 35, and sixth wiring 36 that are formed separate from each other. Pattern shapes of first wiring 31, second wiring 32, and fourth wiring 34 in light-emitting device 2 are the same as those in light-emitting device 1.

In fifth wiring 35, its one end is electrically connected to the first end of second LED array 22A via wire 60 (not illustrated), and its other end is an open end. The open end of fifth wiring 35 is disposed between second wiring 32 and sixth wiring 36 in second connector 40B. In other words, fifth wiring 35 is adjacent to second wiring 32 and sixth wiring 36.

In sixth wiring 36, its one end is electrically connected to the first end of third LED array 23A via wire 60 (not illustrated), and its other end is an open end. The open end of sixth wiring 36 is adjacent to fifth wiring 35 in second connector 40B.

In third wiring 33, its one end is electrically connected to the second end of third LED array 23A via wire 60 (not illustrated), and its other end is an open end. The open end of third wiring 33 is adjacent to first wiring 31 in first connector 40A.

In second connector 40B, multiple connection pads 42 are provided also for sixth wiring 36, same as other wirings. Sixth wiring 36 can be connected to adjacent fifth wiring 35 by conductive member 41.

Light-emitting method 2 can be manufactured using the same method as that of light-emitting device 1.

Figure 11A:
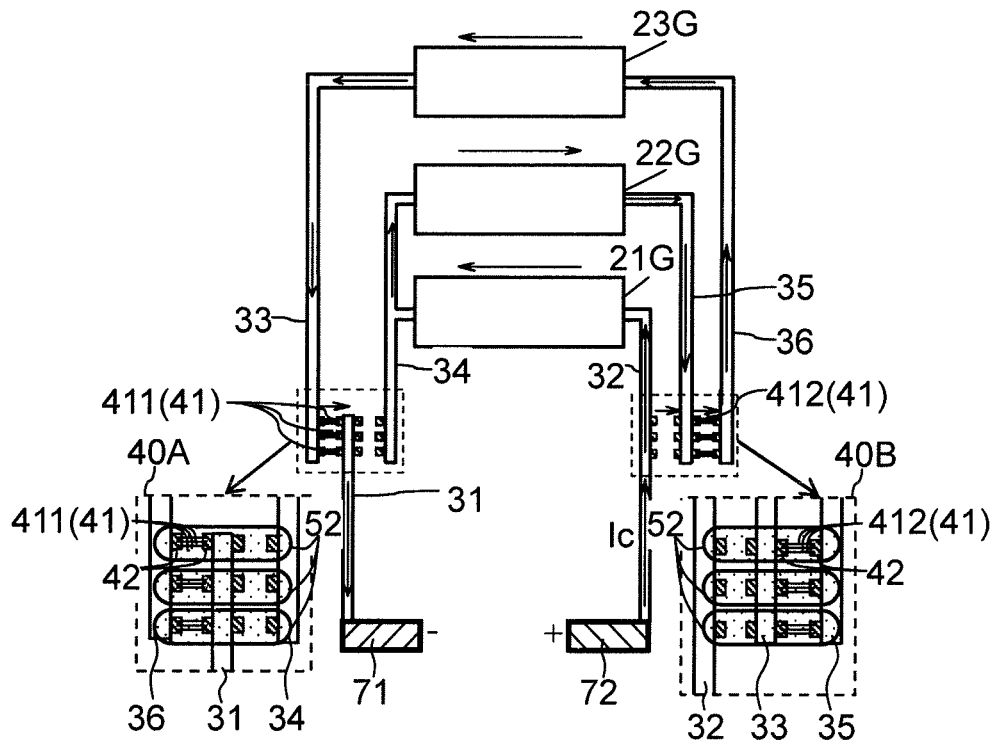
FIG. 11A is a schematic view illustrating a flow of current in the light-emitting device in FIG. 10A when series connection is adopted.
Figure 11B:
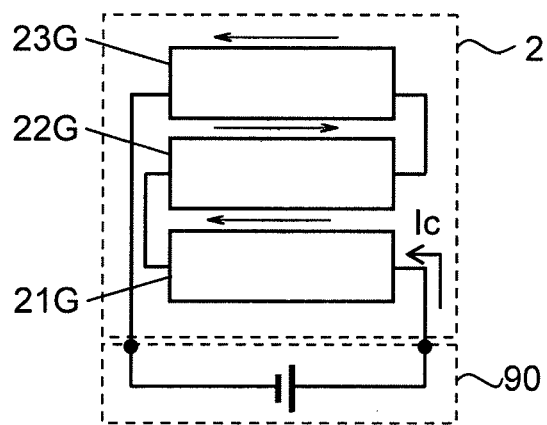
FIG. 11B is an electric diagram of the light-emitting device in FIG. 10A when series connection is adopted.
Figure 12A:
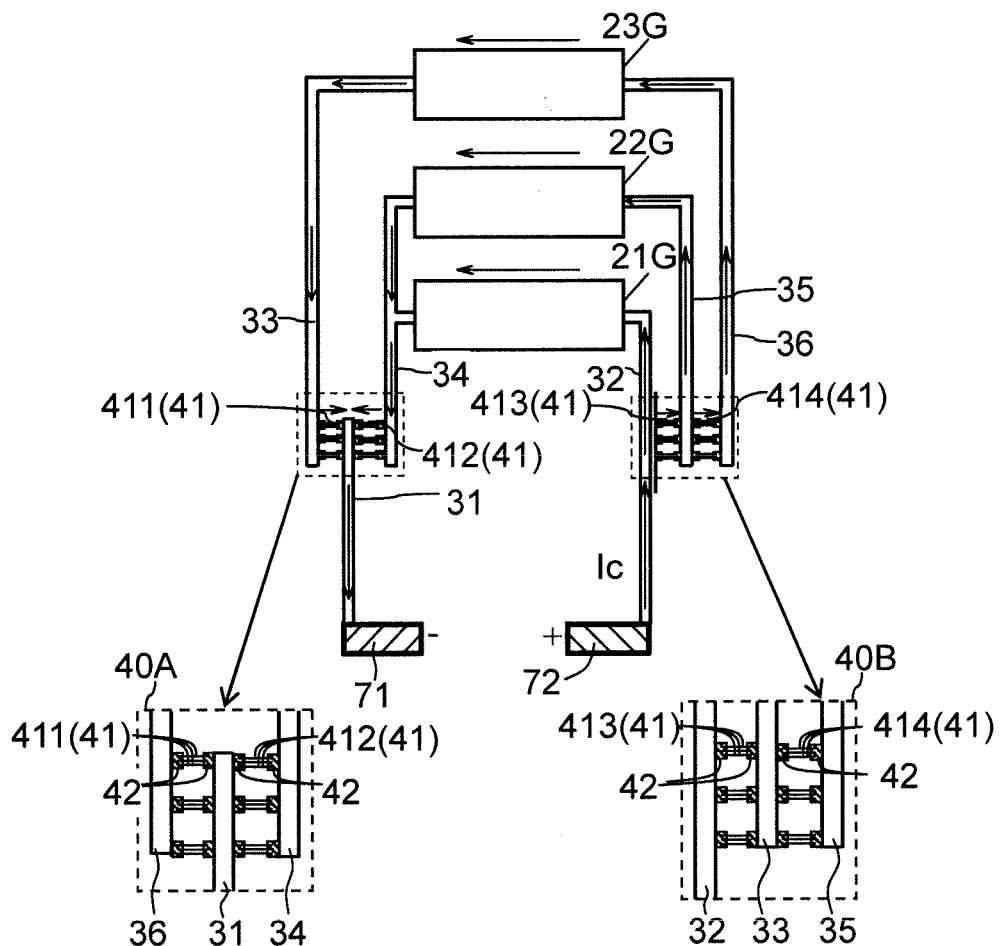
FIG. 12A is a schematic view illustrating a flow of current in the light-emitting device in FIG. 10A when parallel connection is adopted.
Figure 12B:
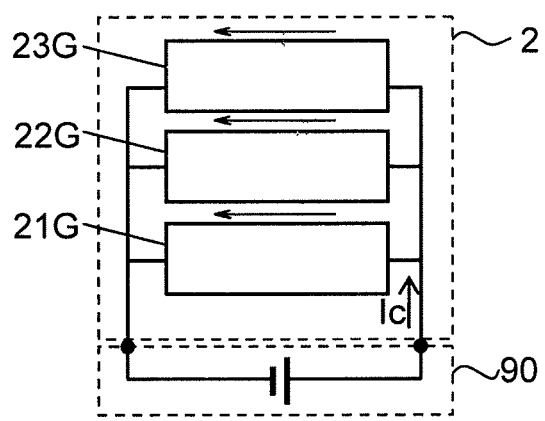
FIG. 12B is an electric circuit diagram of the light-emitting device in FIG. 10A when parallel connection is adopted.

Next, connections of LEDs 20 in light-emitting device 2 are described with reference to FIGS. 11A to 12B. FIG. 11A is a schematic view illustrating the flow of current in light-emitting device 2 in the case of series connection. FIG. 11B is an electric diagram of light-emitting device 2 in FIG. 11A. FIG. 12A is a schematic view of the flow of current in light-emitting device 2 in the case of parallel connection. FIG. 12B is an electric diagram of light-emitting device 2 in FIG. 12A.

The case of connecting first LED group 21G, second LED group 22G, and third LED group 23G in series is described with reference to FIGS. 11A and 11B.

More specifically, as shown in FIG. 11A, first LEDs 21 of first LED array 21A are aligned in the direction opposite to second LEDs 22 of second LED array 22A when seen from the top. In addition, third LEDs 23 of third LED array 23A are aligned in the same direction as first LEDs 21.

In first LED array 21A and third LED array 23A, first LEDs 21 and third LEDs 23 are disposed such that their anode electrodes (+) are positioned toward second wiring 32 (the side of power supply terminal 72). On the other hand, in second LED array 22A, second LEDs 22 are disposed such that their anode electrodes (+) are positioned toward fourth wiring 34 (the side of power supply terminal 71).

Furthermore, only specific pairs of adjacent wirings 30 in first connector 40A and second connector 40B are connected by conductive member 41 so that first LED array 21A, second LED array 22A, and third LED array 23A are connected in series.

In first connector 40A, first wiring 31 and third wiring 33 are electrically connected at least by one first conductive member 411, and first wiring 31 and fourth wiring 34 are not connected. In addition, in second connector 40B, second wiring 32 and fifth wiring 35 are not connected, and fifth wiring 35 and sixth wiring 36 are electrically connected at least by one second conductive member 412.

As shown in FIGS. 11A and 11B, this enables to connect first LED group 21G, second LED group 22G, and third LED group 23G in series. For example, when power circuit 90 for supplying constant current Ic to light-emitting device 2 is connected, forward current Ic/12 runs in each of LEDs 20 in first LED group 21G, second LED group 22G, and third LED group 23G (first LEDs 21, second LEDs 22, and third LEDs 23).

Next is described the case of connecting first LED group 21G, second LED group 22G, and third LED group 23G in parallel, with reference to FIGS. 12A and 12B.

More specifically, as shown in FIG. 12A, first LEDs 21 of first LED array 21A, second LEDs 22 of second LED array 22A, and third LEDs 23 of third LED array 23A are all disposed in the same direction when seen from the top.

In first LED array 21A, first LEDs 21 are disposed such that their anode electrodes (+) are positioned toward second wiring 32 (the side of power supply terminal 72). Still more, in second LED array 22A, second LEDs 22 are also disposed such that their anode electrodes (+) are positioned toward second wiring 32 (the side of power supply terminal 72). Still more, in third LED array 23A, third LEDs 23 are also disposed such that their anode electrodes (+) are positioned to the side of second wiring 32 (the side of power supply terminal 72).

Furthermore, only specific pairs of adjacent wirings 30 in first connector 40A and second connector 40B are connected by conductive member 41 so that first LED array 21A, second LED array 22A, and third LED array 23A are connected in parallel.

In first connector 40A, first wiring 31 and third wiring 33 are electrically connected by at least one first conductive member 411, and first wiring 31 and fourth wiring 34 are electrically connected by at least one second conductive member 412. In second connector 40B, second wiring 32 and fifth wiring 35 are electrically connected by at least one third conductive member 413, and fifth wiring 35 and sixth wiring 36 are electrically connected by at least one fourth conductive member 414.

As shown in FIGS. 12A and 12B, this enables to connect first LED group 21G, second LED group 22G, and third LED group 230 in parallel. For example, when power circuit 90 for supplying constant current Ic to light-emitting device 2 is connected, current Ic/3 runs in first LED group 21G, second LED group 220, and third LED group 23G. And, shunt current of current Ic/3 runs in LEDs 20 (first LEDs 21, second LEDs 22, and third LEDs 23). More specifically, forward current Ic/36 runs in each of first LEDs 21, second LEDs 22, and third LEDs 23.

In the same way as light-emitting device 1, first LEDs 21, second LEDs 22, and third LEDs 23 may be disposed in the same direction even if first LED array 21A, second LED array 22A, and third LED array 23A are connected in series.

As described above, same as light-emitting device 1, light-emitting device 2 enables to select series connection or parallel connection of LEDs 20 (first LEDs 21, second LEDs 22, and third LEDs 23). Accordingly, a single type of substrate 10 can support multiple different specifications.

Still more, also in light-emitting device 2, the sealing area consists of multiple first sealing members 51. Therefore, same as light-emitting device 1, an effect of suppressing internal stress can be obtained. A risk of disconnection of wires 60 can also be reduced. Accordingly, a highly-reliable light-emitting device can be achieved.

Figure 13:
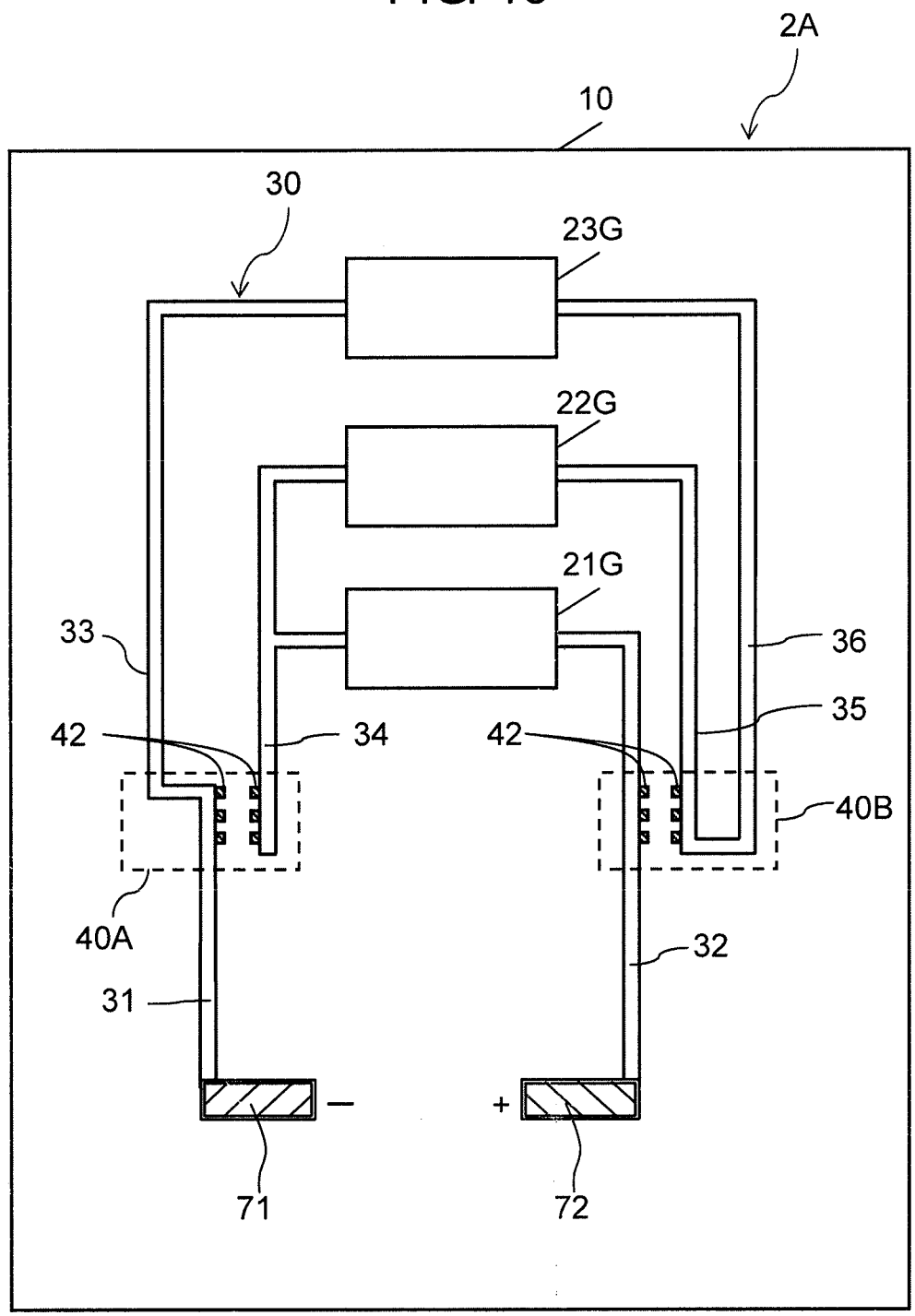
FIG. 13 is a wiring pattern of the light-emitting device in a modification of the light-emitting device in FIG. 10A.

Still more, light-emitting device 2 may have a pattern shown in FIG. 13 for wirings 30. FIG. 13 illustrates a wiring pattern of light-emitting device 2A, which is modification of light-emitting device 2.

In light-emitting device 2A, first LED array 21A having multiple first LEDs 21 connected in series is provided on substrate 10. In addition, second LED array 22A having multiple second LEDs 22 connected in series is provided. Furthermore, third LED array 23A having multiple third LEDs 23 connected in series is provided. Multiple wirings are provided on substrate 10, including first wiring 31, second wiring 32, third wiring 33 electrically connected to first wiring 31, fourth wiring 34, fifth wiring 35, and sixth wiring 36 electrically connected to fifth wiring. Still more, on substrate 10, first connector 40A in which first wiring 31 and fourth wiring 34 are disposed adjacent to each other, second connector 40B in which first connector 40A, second wiring 32, and fifth wiring 35 are disposed adjacent to each other, and a pair of power supply terminals 71 and 72 is provided. First wiring 31 is electrically connected to power supply terminal 71, and second wiring 32 is electrically connected to the first end of first LED array 21A and power supply terminal 72. Fourth wiring 34 is electrically connected to the second end of first LED array 21A and the second end of second LED array 22A. The first end of third LED array 23A is electrically connected to sixth wiring 36, and the second end of third LED array 23A is electrically connected to third wiring 33.

In other words, as shown in FIG. 13, first wiring 31 and third wiring 33 are a single wiring without being separated in light-emitting device 2A. Fifth wiring 35 and sixth wiring 36 are also a single wiring without being separated.

Also with this structure, connections same as light-emitting device 2 shown in FIG. 10 are achieved by connecting or not connecting connection pads 42 by conductive member 41 in first connector 40A and second connector 40B.

More specifically, in FIG. 13, first LED array 21A, second LED array 22A, and third LED array 23A can be connected in series, same as FIG. 11B, by not connecting connection pads 42 (not providing conductive member 41) in first connector 40A and second connector 40B.

On the other hand, first wiring 31 and fourth wiring 34 are electrically connected by at least one first conductive member 411 on at least a pair of connection pads 42 in first connector 40A. In the same way, at least a pair of connection pads 42 in second connector 40B is connected by at least one second conductive member 412. This enables to connect first LED array 21A, second LED array 22A, and third LED array 23A in parallel, same as FIG. 12B.

Accordingly, light-emitting device 2A in FIG. 13 can simplify wirings 30 (metal wirings), compared to light-emitting device 2 in FIG. 10.

(Lighting Apparatus)

Figure 14:
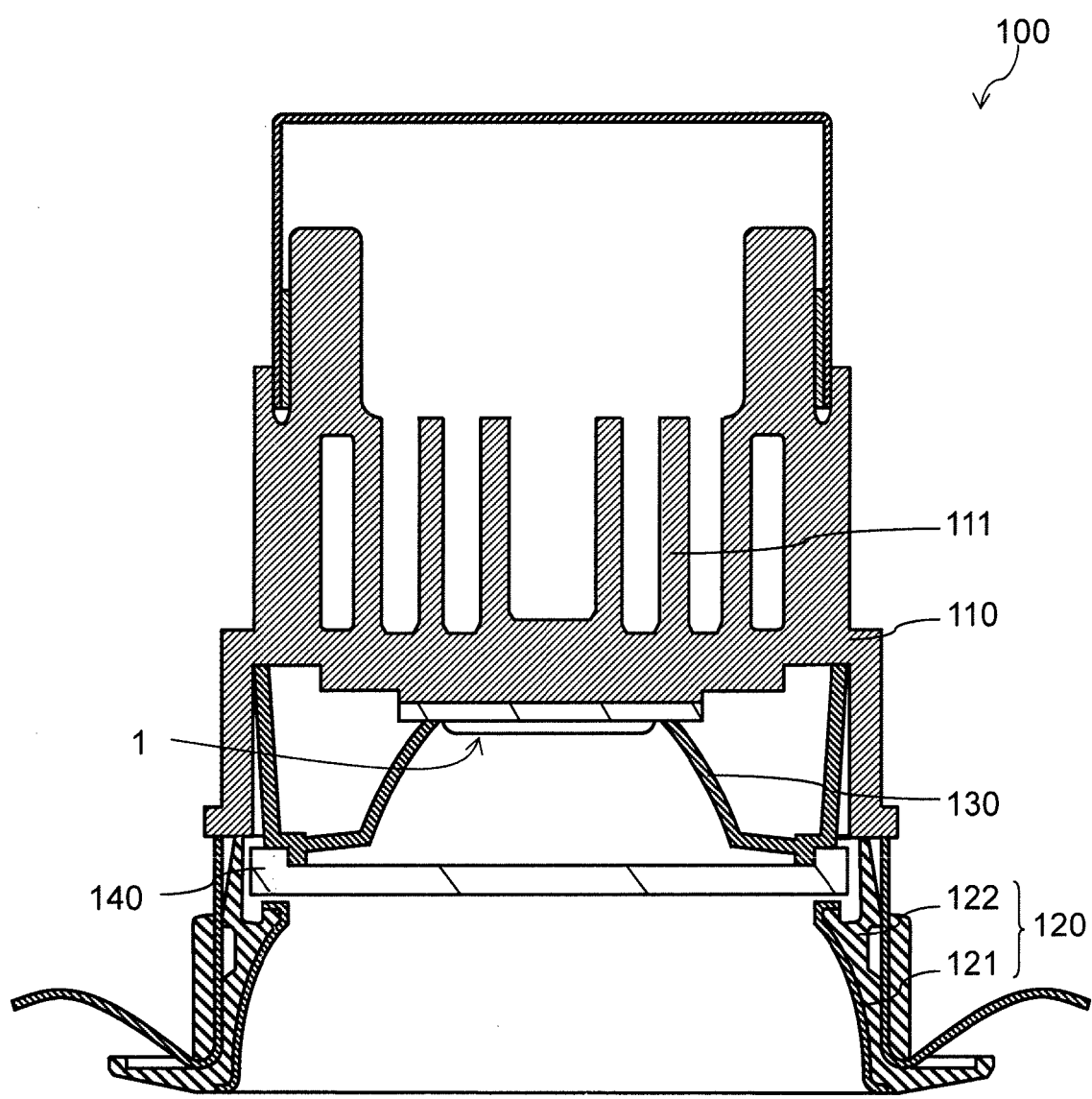
FIG. 14 is a sectional view of a lighting apparatus in an exemplary embodiment.
Figure 15:
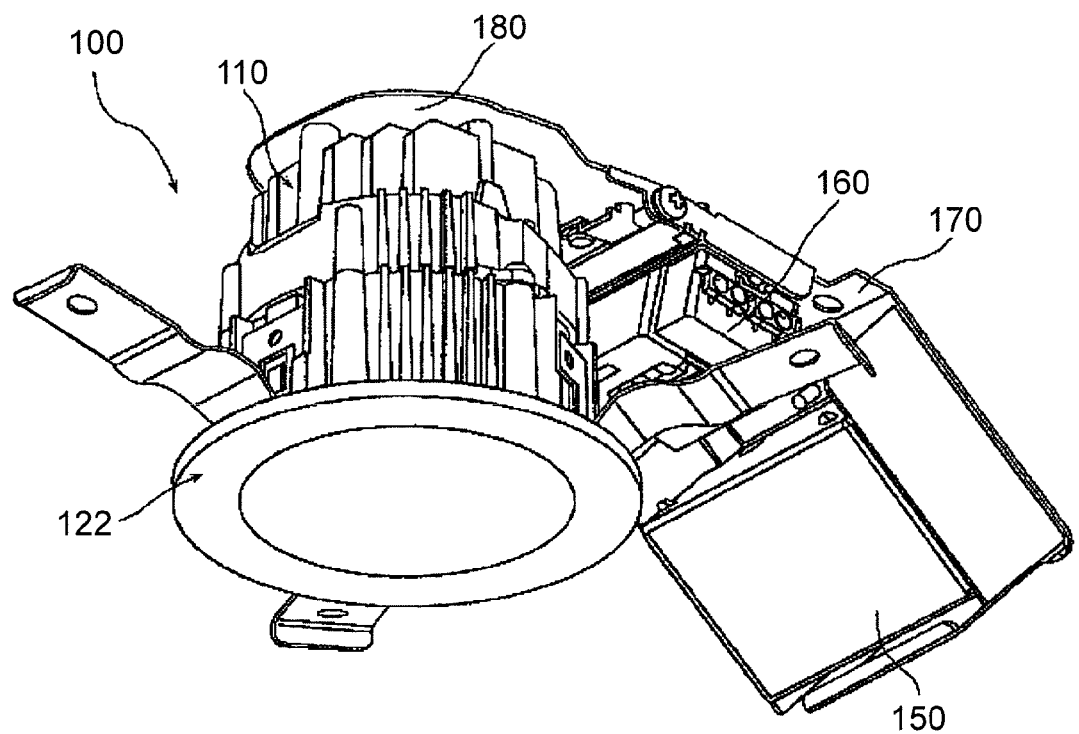
FIG. 15 is a perspective view of an appearance of the lighting apparatus in FIG. 14 and peripheral members connected to this lighting apparatus.

Next, lighting apparatus 100 in the exemplary embodiment is described with reference to FIGS. 14 and 15. FIG. 14 is a sectional view of lighting apparatus 100 (ceiling-embedded type). FIG. 15 is a perspective view of an appearance of lighting apparatus 100 to be connected to peripheral members (lighting device and terminal base).

Lighting apparatus 100 is, for example, an embedded lighting apparatus, such as a downlight, for irradiating light downward (corridor, wall, etc.) by being embedded in a ceiling typically of a house. Lighting apparatus 100 includes light-emitting device 1 that is an LED light source, a substantially-tubular apparatus body with bottom formed by joining base 110 and frame 120, and reflector 130 and translucent panel 140 disposed in this apparatus body. Light-emitting device 2 or 2A may be used instead of light-emitting device 1.

Base 110 is an attachment base for receiving light-emitting device 1. It is also a heat sink for releasing heat generated in light-emitting device 1. Base 110 is typically formed by metal in a substantially cylindrical shape. For example, aluminum die-cast can be used for lighting apparatus 100.

Multiple heat-release fins 111 protruding upward are provided at a constant interval in one direction on an upper part of base 110. This enables to efficiently dissipate heat generated in light-emitting device 1.

Frame 120 includes substantially tubular cone 121 having a reflective face on its inner face, and frame body 122 for attaching cone 121. Cone 121 is formed using metal. For example, cone 12 is made by drawing or pressing aluminum alloy. Frame body 122 is formed of a rigid resin material or metal material. Frame body 120 is fixed by attaching frame body 122 to base 110.

Reflector 130 is an annular-frame (funnel shape) having a reflective inner-face. Reflector 130 can be formed using metal, such as aluminum. Reflector 130 may not be metal. It may be formed with a rigid white resin material.

Translucent panel 140 is a flat plate disposed between reflector 130 and frame body 120, and is attached to reflector 130. Translucent panel 140 can be formed in a disk shape using a transparent resin material, such as acryl and polycarbonate.

However, translucent panel 140 is not necessarily provided. If translucent panel 140 is not provided, luminous flux of a lighting apparatus can be improved.

As shown in FIG. 15, lighting device 150 for supplying lighting power to light-emitting device 1 and terminal base 150 for relaying AC power from a commercial power source to lighting device 160 are connected to lighting apparatus 100.

Lighting device 150 and terminal base 160 are attached and fixed to attachment plate 170 provided separately from the apparatus body. Attachment plate 170 is formed by bending a rectangular metal sheet. Lighting device 150 is attached and fixed to the bottom face at one end in the longer direction, and terminal base 160 is attached and fixed to the bottom face at the other end. Attachment plate 170 is mutually connected to top plate 180 attached and fixed onto the top of base 110 of the apparatus body.

As described above, lighting apparatus 100 can be achieved by employing light-emitting device 1, 2, or 2A.

(Others)

As described above, light-emitting devices 1, 2, and 2A, lighting apparatus 100, and substrate 10 on which wirings 30 are provided are described with reference to exemplary embodiments. However, the subject matter is not limited to these exemplary embodiments.

For example, blue LED chips and yellow phosphor are combined in light-emitting devices 1, 2, 2A (LED modules). However, the combination is not limited. For example, phosphor-containing resin that contains red phosphor and green phosphor may be combined with blue LEDs. Alternatively, ultraviolet LED chips discharging ultraviolet light that has a wavelength shorter than blue LED chips may be combined with blue phosphor particles, green phosphor particles, and red phosphor particles that discharge blue light, red light, and green light by being excited mainly by ultraviolet light.

Still more, in light-emitting devices 1, 2, and 2A, an LED is given as an example of a light-emitting element. A semiconductor light-emitting element, such as a semiconductor laser, EL elements, such as organic EL (Electric Luminescence) and inorganic EL, and other solid light-emitting elements may also be used.

Furthermore, embodiments achieved by a range of modifications that may come up to each exemplary embodiment and embodiments achieved by arbitrary combining components and functions of each exemplary embodiment without departing from the spirit of the disclosure are intended to be embraced therein.

The light-emitting device in the disclosure includes the substrate, first LEDs and second LEDs mounted on the substrate, wirings separately formed on the substrate, and conductive members for connecting adjacent two wirings in multiple wirings. First LEDs and second LEDs can be connected in series or parallel, or in combination of series and parallel. This enables to support multiple different specifications, using a single type of substrate.

What is claimed is:

1. A light-emitting device comprising:
   a substrate;
   a first light-emitting element array mounted on the substrate and having a plurality of first light-emitting elements connected in series;
   a second light-emitting element array mounted on the substrate and having a plurality of second light-emitting elements connected in series;
   a first sealing member for sealing the plurality of first light-emitting elements and the plurality of second light-emitting elements;
   a plurality of wirings provided on the substrate and including a first wiring, a second wiring, a third wiring, a fourth wiring, and a fifth wiring;
   a first connector in which the first wiring and the third wiring are disposed adjacent to each other, and the first wiring and the fourth wiring are disposed adjacent to each other;
   a second connector in which the second wiring and the fifth wiring are disposed adjacent to each other; and
   at least one first conductive member for electrically connecting the first wiring and at least one of the third wiring and the fourth wiring in the first connector.

2. The light-emitting device of claim 1, wherein
   the first light-emitting element array and the second light-emitting element array are one of a plurality of first light-emitting element arrays and one of a plurality of second light-emitting element arrays, respectively, having a same number of arrays,
   the plurality of first light-emitting element arrays are connected in parallel, and the plurality of second light-emitting element arrays are connected in parallel, and
   a total number of the at least one first conductive member in the first connector is not greater than the same number of arrays.

3. The light-emitting device of claim 1, wherein
   the at least one first conductive member is a wire.

4. The light-emitting device of claim 1, wherein
   power is supplied from a same power source to the first light-emitting elements and the second light-emitting elements.

5. A lighting apparatus comprising:
   the light-emitting device of claim 1; and
   an attachment base for receiving the light-emitting device.

6. The light-emitting device of claim 1, wherein
   each of the plurality of first light-emitting elements and the plurality of second light-emitting elements configures a linear element array, and
   the first sealing member seals the plurality of first light-emitting elements and the plurality of second light-emitting elements along the element array.

7. The light-emitting device of claim 6, wherein
   at least one of the plurality of first light-emitting elements and the plurality of second light-emitting elements is aligned in a plurality of linear arrays.

8. The light-emitting device of claim 1, wherein
   at least one pair of connection pads is provided between each of the first wiring and the third wiring, and the first wiring and the fourth wiring in the first connector,
   the at least one first conductive member connects the at least one pair of connection pads together, and
   a second sealing member seals the at least one first conductive member.

9. The light-emitting device of claim 8, wherein
   the at least one pair of connection pads protrudes, facing each other, in the first connector.

10. The light-emitting device of claim 8, wherein
    the second sealing member seals the at least one first conductive member for the at least each pair of connection pads.

11. The light-emitting device of claim 8, wherein
    the first sealing member and the second sealing member are formed using a same material.

12. The light-emitting device of claim 1, further comprising:
    a pair of power supply terminals,
    wherein
    the first wiring is electrically connected to one of the pair of power supply feeding terminals, the second wiring is electrically connected to a first end of the first light-emitting element array and an other of the pair of power supply terminals, the fifth wiring is electrically connected to a first end of the second light-emitting element array, and the fourth wiring is electrically connected to a second end of the first light-emitting element array and a second end of the second light-emitting element array.

13. The light-emitting device of claim 12, wherein the at least one first conductive member electrically connects the first wiring and the third wiring in the first connector, and the third wiring and the fifth wiring are electrically connected.

14. The light-emitting device of claim 12, further comprising:

a second conductive member for electrically connecting the second wiring and the fifth wiring in the second connector, wherein the at least one first conductive member electrically connects the first wiring and the fourth wiring in the first connector, and the third wiring and the fifth wiring are electrically connected.

15. The light-emitting device of claim 12, further comprising:

a third light-emitting element array mounted on the substrate and being configured with a plurality of third light-emitting elements connected in series, wherein the plurality of wirings further include a sixth wiring, the sixth wiring is disposed adjacent to the fifth wiring in the second connector, a first end of the third light-emitting element array is electrically connected to the sixth wiring, and a second end of the third light-emitting element array is electrically connected to the third wiring.

16. The light-emitting device of claim 15, further comprising:

at least one second conductive member for electrically connecting the fifth wiring and the sixth wiring in the second connector, wherein the at least one first conductive member electrically connects the first wiring and the third wiring in the first connector.

17. The light-emitting device of claim 15, further comprising:

at least one second conductive member for electrically connecting the first wiring and the fourth wiring in the first connector;

at least one third conductive member for electrically connecting the second wiring and the fifth wiring in the second connector; and at least one fourth conductive member for electrically connecting the fifth wiring and the sixth wiring in the second connector, wherein the at least one first conductive member electrically connects the first wiring and the third wiring in the first connector.

18. A light-emitting device comprising:

a substrate;

a first light-emitting element array mounted on the substrate and having a plurality of first light-emitting elements connected in series;

a second light-emitting element array mounted on the substrate and having a plurality of second light-emitting elements connected in series;

a third light-emitting element array mounted on the substrate and having a plurality of third light-emitting elements connected in series;

a plurality of wirings provided on the substrate and including a first wiring, a second wiring, a third wiring electrically connected to the first wiring, a fourth wiring, a fifth wiring, and a sixth wiring electrically connected to the fifth wiring;

a first connector in which the first wiring and the fourth wiring are disposed adjacent to each other;

a second connector in which the second wiring and the fifth wiring are disposed adjacent to each other; and a pair of power supply terminals, wherein the first wiring is electrically connected to one of the pair of power supply terminals, the second wiring is electrically connected to a first end of the first light-emitting element array and the other one of the pair of power supply terminals, the fourth wiring is electrically connected to a second end of the first light-emitting element array and a second end of the second light-emitting element array, and a first end of the third light-emitting element array is electrically connected to the sixth wiring, and a second end of the third light-emitting element array is electrically connected to the third wiring.

19. The light-emitting device of claim 18, further comprising:

at least one first conductive member for electrically connecting the first wiring and the fourth wiring in the first connector; and a second conductive member for electrically connecting the second wiring and the fifth wiring in the second connector.

* * * * *